(12) United States Patent
Yokoyama et al.

(10) Patent No.: US 11,006,556 B2
(45) Date of Patent: May 11, 2021

(54) ELECTROMAGNETIC SHIELD STRUCTURE AND WIRE HARNESS

(71) Applicants: FURUKAWA ELECTRIC CO., LTD., Tokyo (JP); FURUKAWA AUTOMOTIVE SYSTEMS INC., Shiga (JP)

(72) Inventors: Hiroaki Yokoyama, Shiga (JP); Yoshikazu Tanaka, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 0 days.

(21) Appl. No.: 16/837,460

(22) Filed: Apr. 1, 2020

(65) Prior Publication Data

US 2020/0229329 A1 Jul. 16, 2020

Related U.S. Application Data

(63) Continuation of application No. 16/363,466, filed on Mar. 25, 2019, now Pat. No. 10,660,248, which is a
(Continued)

(30) Foreign Application Priority Data

Sep. 26, 2016 (JP) .............................. JP2016-187052
Sep. 26, 2016 (JP) .............................. JP2016-187057

(51) Int. Cl.
*H05K 9/00* (2006.01)
*H02G 3/04* (2006.01)
(Continued)

(52) U.S. Cl.
CPC ......... *H05K 9/0098* (2013.01); *H01B 7/0045* (2013.01); *H02G 3/0481* (2013.01); *H02G 15/105* (2013.01); *B60R 16/0215* (2013.01)

(58) Field of Classification Search
CPC .................................................... H05K 9/0098
See application file for complete search history.

(56) References Cited

U.S. PATENT DOCUMENTS 8,946,553 B2 * 2/2015 Kawase ............... H01R 9/0509
174/74 R
9,676,348 B2 * 6/2017 Sugino ................ B60R 16/0215
(Continued)

FOREIGN PATENT DOCUMENTS

CN 101437388 A 5/2009
CN 103621195 A 3/2014
(Continued)

OTHER PUBLICATIONS

International Search Report issued in PCT Patent Application No. PCT/JP2017/034686 dated Dec. 19, 2017.
(Continued)

*Primary Examiner* — Hung V Ngo
(74) *Attorney, Agent, or Firm* — Marshall, Gerstein & Borun LLP

(57) ABSTRACT

A first braided wire and a second braided wire that are two cylindrical flexible shield members are fixed with a crimp member at different positions in the circumferential direction on a cross section perpendicular to the longitudinal direction of the electromagnetic shield pipe. Thus, the cylindrical end portions of the braided wires are loosened, and each of sheet-like portions is formed on the end portion, and the sheet-like portions of the end portions of the braided wires are disposed at different positions in the circumferential direction of the electromagnetic shield pipe and fixed with the crimp member on a metal layer of the electromag-
(Continued)

netic shield pipe. That is, the braided wires are fixed in a section crimped by the crimp member without being overlapped with each other in the circumferential direction of the electromagnetic shield pipe.

2 Claims, 23 Drawing Sheets

Related U.S. Application Data continuation of application No. PCT/JP2017/034686, filed on Sep. 26, 2017.

(51) Int. Cl.
*H02G 15/105* (2006.01)
*H01B 7/00* (2006.01)
*B60R 16/02* (2006.01)

(56) References Cited

U.S. PATENT DOCUMENTS

| | | |
|---|---|---|
| 2009/0126985 A1 | 5/2009 | Aoki et al. |
| 2010/0073006 A1 | 3/2010 | Gilliland |
| 2013/0032393 A1* | 2/2013 | Toyama ............... H05K 9/0098 |
| | | 174/72 A |
| 2013/0341060 A1 | 12/2013 | Kozawa et al. |
| 2014/0179161 A1* | 6/2014 | Imahori ............. H01R 13/6592 |
| | | 439/607.45 |
| 2014/0202756 A1 | 7/2014 | Adachi et al. |
| 2014/0202763 A1* | 7/2014 | Adachi .................. H01B 17/42 |
| | | 174/72 A |
| 2015/0008032 A1* | 1/2015 | Nakai .................. H02G 3/0468 |
| | | 174/650 |
| 2015/0155638 A1* | 6/2015 | Nagahashi ........... H05K 9/0018 |
| | | 174/74 R |
| 2015/0289420 A1* | 10/2015 | Imahori .................. H01F 17/06 |
| | | 174/350 |
| 2016/0134090 A1* | 5/2016 | Kushima .............. H02G 3/0481 |
| | | 174/362 |
| 2016/0295755 A1 | 10/2016 | Lee et al. |
| 2019/0029149 A1 | 1/2019 | Shimizu et al. |

FOREIGN PATENT DOCUMENTS

| | | |
|---|---|---|
| CN | 103826927 A | 5/2014 |
| JP | 2015-106466 A | 6/2015 |

OTHER PUBLICATIONS

Office Action issued in Chinese Patent Application No. 201780058877.8 dated Jan. 3, 2020.
Extended European Search Report issued in European Patent Application No. 17853227.1 dated Apr. 28, 2020.

* cited by examiner

ELECTROMAGNETIC SHIELD STRUCTURE AND WIRE HARNESS

TECHNICAL FIELD

The present invention relates to an electromagnetic shield structure including a cable laid inside and used for an electric vehicle, for example.

BACKGROUND

Conventionally, an electromagnetic shield pipe such as a metallic pipe or a composite pipe composed of a metallic layer and a resin layer is used as a protective pipe of a cable. Influence on the outside caused by noise that is generated from a cable inside or influence on the cable inside caused by noise on the outside can be suppressed by storing the cable in the electromagnetic shield pipe.

Herein, for example, in an automobile, in some cases, a plurality of cables such as a high-voltage electric wire for connecting a high-voltage battery and an inverter and a low-voltage electric wire for connecting a low-voltage battery and a relay box is stored in one electromagnetic shield pipe. In this case, generally, noise from the high-voltage electric wire is shielded so as not to be transmitted to the low-voltage electric wire in the interior of the electromagnetic shield pipe. As this specific example, an example in which the low-voltage electric wire is inserted into a shielding member (e.g., braided wire) is given.

In contrast, the high-voltage electric wire and the low-voltage electric wire that are exposed from the end portion of the electromagnetic shield pipe are respectively inserted into the shielding member (e.g., braided wire) so as not to come under the influence of noise. This shielding member is connected to the electromagnetic shield pipe in a conductive manner and constitutes an electromagnetic shield structure.

As this electromagnetic shield structure, for example, there is a method in which a braided wire into which the high-voltage electric wire is inserted and a braided wire into which the low-voltage electric wire is inserted are overlapped, and crimped with a crimp member such as a ring on a metallic portion (conductive portion) such as an end of an electromagnetic shield pipe (JP 2015-106466 A).

However, in the electromagnetic shield structure of Patent Document 1, on a connection portion between the braided wire and the electromagnetic shield pipe, there is an overlapping portion of the braided wire into which the high-voltage electric wire is inserted and the braided wire into which the low-voltage electric wire is inserted, and sections having a thickness different from the thickness of the overlapping portion occur on both sides of the overlapping portion. Thus, there are concerns about a holding strength of a crimping body might be reduced in a step of a thickness-varying portion of the braided wire which is the crimping body.

For example, holding strength on both sides of the overlapping portion of the braided wire is reduced due to heat cycle, repetitive bending, or tensile force, which might cause the shift or coming off of the braided wire, the coming off of the ring, and the like. Thus, there are concerns about stability regarding an energized state between the braided wire and the shield pipe or the holding strength of a crimp.

The present invention has been made in view of these problems, and it is an object of the present invention to provide an electromagnetic shield structure capable of securing a stable energizing state between a flexible shield member and an electromagnetic shield pipe and maintaining the holding strength of the flexible shield member for the long term.

SUMMARY OF THE DISCLOSURE

In order to achieve the aforementioned object, a first invention is such that an electromagnetic shield structure includes an electromagnetic shield pipe, a plurality of cables configured to be inserted into the electromagnetic shield pipe and exposed from an end portion of the electromagnetic shield pipe, and a plurality of cylindrical flexible shield members configured to cover the plurality of cables exposed from the end portion of the electromagnetic shield pipe, wherein the plurality of cylindrical flexible shield members is fixed with a crimp member on an outer circumference of the electromagnetic shield pipe, and an entire outer circumferential surface of each of the plurality of cylindrical flexible shield members is pressed by the crimp member from an outer circumferential side, on a cross section perpendicular to a longitudinal direction of the electromagnetic shield pipe in a portion where the crimp member is disposed.

The plurality of cylindrical flexible shield members may include at least a first cylindrical flexible shield member and a second cylindrical flexible shield member, and the first cylindrical flexible shield member and the second cylindrical flexible shield member may be fixed with the crimp member on the outer circumference of the electromagnetic shield pipe at an identical position in the longitudinal direction of the electromagnetic shield pipe, and the first cylindrical flexible shield member and the second cylindrical flexible shield member may be fixed with the crimp member without being overlapped in a circumferential direction, on the cross section perpendicular to the longitudinal direction of the electromagnetic shield pipe.

The first cylindrical flexible shield member may be fixed in a substantially semicircle in the circumferential direction of the electromagnetic shield pipe, and the second cylindrical flexible shield member may be fixed in another substantially semicircle in the circumferential direction of the electromagnetic shield pipe.

The first cylindrical flexible shield member may be configured to cover the outer circumference of the electromagnetic shield pipe, and a hole corresponding to a part of a section that covers the outer circumference of the electromagnetic shield pipe may be provided in the first cylindrical flexible shield member, and the second cylindrical flexible shield member may be configured to cover a position of the hole, and the first cylindrical flexible shield member and the second cylindrical flexible shield member may be fixed with the crimp member on the electromagnetic shield pipe in a portion corresponding to the hole.

The first cylindrical flexible shield member and the second cylindrical flexible shield member each include a cylindrical end portion formed in a sheet-like shape, and the end portion of the first cylindrical flexible shield member and the end portion of the second cylindrical flexible shield member may be disposed at different positions in the circumferential direction of the electromagnetic shield pipe, and the first cylindrical flexible shield member and the second cylindrical flexible shield member may be fixed with the crimp member on the electromagnetic shield pipe.

In addition, the plurality of cylindrical flexible shield members may be fixed with the crimp member at an identical position in the longitudinal direction of the electromagnetic shield pipe, and the plurality of cylindrical flexible shield members may be fixed with the crimp member in a state of being overlapped across an entire circumference in a circumferential direction, on a cross section perpendicular to the longitudinal direction of the electromagnetic shield pipe.

In addition, the plurality of cylindrical flexible shield members may include at least a first cylindrical flexible shield member and a second cylindrical flexible shield member, and the first cylindrical flexible shield member and the second cylindrical flexible shield member may be fixed with a first crimp member and a second crimp member respectively on the outer circumference of the electromagnetic shield pipe at different positions in the longitudinal direction of the electromagnetic shield pipe.

At least one of the first cylindrical flexible shield member and the second cylindrical flexible shield member may be fixed in a substantially semicircle in the circumferential direction of the electromagnetic shield pipe.

The first cylindrical flexible shield member may be fixed with the first crimp member on an end portion side of the electromagnetic shield pipe, and the second cylindrical flexible shield member may be fixed with the second crimp member on a base portion side of the electromagnetic shield pipe through an outer circumference of the first crimp member, and a protective member may be provided between the first crimp member and the second cylindrical flexible shield member.

The first cylindrical flexible shield member may be fixed with the first crimp member on an end portion side of the electromagnetic shield pipe, and the second cylindrical flexible shield member may be fixed with the second crimp member on a base portion side of the electromagnetic shield pipe through an outer circumference of the first crimp member, and the second cylindrical flexible shield member may be disposed to avoid a protruding portion of the first crimp member.

The first cylindrical flexible shield member may penetrate the second cylindrical flexible shield member, and end portions of the first cylindrical flexible shield member and the second cylindrical flexible shield member may be fixed on substantially an entire circumference in a circumferential direction of the electromagnetic shield pipe at respective portions.

According to the first invention, each of the plurality of cylindrical flexible shield members is crimped with the crimp member from the outer circumferential side across the entire surface of its entire outer circumferential surface and fixed on the electromagnetic shield pipe, so that a portion having weak holding strength does not occur on the fixing portion of all the cylindrical flexible shield members. Thus, the shift of the cylindrical flexible shield member or the failure of electrical conduction is unlikely to occur.

In addition, when the first cylindrical flexible shield member and the second cylindrical flexible shield member are fixed with the crimp member at the identical position in the longitudinal direction of the electromagnetic shield pipe without being overlapped, change in the thickness of the cylindrical flexible shield members in the crimp portion (which indicates the fixing portion of the cylindrical flexible shield member described above. The same is applied hereinafter) is small. Thus, the shift of the cylindrical flexible shield member or the failure of electrical conduction is unlikely to occur.

In addition, in this case, the first cylindrical flexible shield member and the second cylindrical flexible shield member are respectively disposed so as to cover each of substantially semicircles of the electromagnetic shield pipe and fixed with the crimp members, so that the contact area between each cylindrical flexible shield member and the electromagnetic shield pipe can be secured. In addition, a portion where there is no cylindrical flexible shield member can be kept to a minimum, so that the occurrence of the shift of each cylindrical flexible shield member can be suppressed.

In addition, the first cylindrical flexible shield member, part of which forms a hole, covers the outer circumference of the electromagnetic shield pipe, and the second cylindrical flexible shield member covers on a portion corresponding to the hole and crimped, can prevent the respective cylindrical flexible shield members from being overlapped with each other at the crimp portion.

In addition, the end portions of the first cylindrical flexible shield member and the second cylindrical flexible shield member formed in a cylindrical shape are molded in a sheet-like shape, and the respective sheet-like cylindrical flexible shield members are disposed at different positions in the circumferential direction of the electromagnetic shield pipe, which allows the cylindrical flexible shield members not to be overlapped with each other.

In addition, when respective cylindrical flexible shield members are crimped in a cylindrical shape across the entire circumference at an identical position in the longitudinal direction of the electromagnetic shield pipe while being overlapped, there is no change in the thickness of the cylindrical flexible shield members in the crimp portion. Thus, the shift of the cylindrical flexible shield member or the failure of electrical conduction is unlikely to occur.

In addition, when the first cylindrical flexible shield member and the second cylindrical flexible shield member are crimped by respective crimp members at different portions in the longitudinal direction of the electromagnetic shield pipe, the respective cylindrical flexible shield members are not overlapped at each of the crimp portions. Thus, the shift of the cylindrical flexible shield member or the failure of electrical conduction is unlikely to occur.

In addition, in this case, at least one of the first cylindrical flexible shield member and the second cylindrical flexible shield member is disposed to cover a substantially semicircle of the electromagnetic shield pipe, and thus the contact area between each cylindrical flexible shield member and the electromagnetic shield pipe can be secured.

In addition, the protective member is sandwiched between the cylindrical flexible shield member and the protruding portion of the crimp member, so that the cylindrical flexible shield member can be prevented from being damaged by the protruding portion of the crimp member.

In addition, the cylindrical flexible shield member fixed on the base portion side of the electromagnetic shield pipe is disposed to avoid the protruding portion of the crimp member, so that the cylindrical flexible shield member can be prevented from being damaged by the protruding portion of the crimp member.

In addition, each of the cylindrical flexible shield members is disposed and fixed across substantially the entire circumference, so that the contact area between each cylindrical flexible shield member and the electromagnetic shield pipe can be secured.

A second invention is a wire harness including the electromagnetic shield structure according to the first invention and the plurality of cables disposed in an interior of the electromagnetic shield pipe.

According to the second invention, the same effect as that in the first embodiment can be achieved by the wire harness including the electromagnetic shield structure of the first invention.

According to the present invention, an electromagnetic shield structure that is capable of securing a stable energizing state between the flexible shield member and the electromagnetic shield pipe and maintaining the holding strength of the flexible shield member for the long term, can be provided.

BRIEF DESCRIPTION OF DRAWINGS

FIG. 6A is a side view of another embodiment illustrating a state where a cable 9a is covered with a braided wire 11a.

FIG. 6B is a plan view of another embodiment illustrating a state where the cable 9a is covered with the braided wire 11a.

FIG. 8 is a side view of an electromagnetic shield structure 1a.

FIG. 9 is a cross-sectional view illustrating the electromagnetic shield structure 1a.

FIG. 11A is a side view of another embodiment illustrating a state where the cable 9a is covered with the braided wire 11a.

FIG. 11B is a plan view of another embodiment illustrating a state where the cable 9a is covered with the braided wire 11a.

FIG. 19A is a side view illustrating a state where the cable 9a is covered with the braided wire 11a.

FIG. 19B is a plan view illustrating a state where the cable 9a is covered with the braided wire 11a.

FIG. 20 is a side view illustrating a state where the braided wire 11a is fixed with the crimp member 13a.

FIG. 22A is a side view illustrating a state where the cable 9a is covered with the braided wire 11a.

DETAILED DESCRIPTION

First Embodiment

Figure 1A:
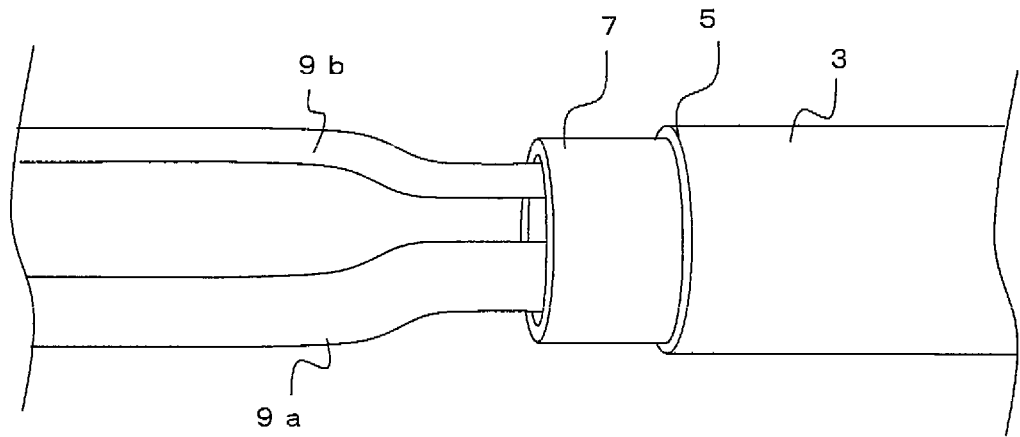
FIG. 1A is a view illustrating an electromagnetic shield pipe 3.

Hereinafter, an electromagnetic shield pipe 3 according to an embodiment of the present invention will be described. FIG. 1A is a side view illustrating the electromagnetic shield pipe 3. The electromagnetic shield pipe 3 includes a metal layer 7 and an outer layer 5 made of resin and provided on the outer circumference thereof. Note that the electromagnetic shield pipe 3 may be a metal pipe that does not include the outer layer 5 and may include another layer on the inside or outside of the metal layer 7.

Note that any material may be used for the metal layer 7 as long as the shield effect can be obtained, and for example, the metal layer 7 may be made of aluminum (including an aluminum alloy).

The outer layer 5 of the electromagnetic shield pipe 3 is peeled off by a predetermined length from an end portion. That is, the metal layer 7 is exposed only by a predetermined range on the end portion of the electromagnetic shield pipe 3. The exposed metal layer 7 serves as a connection portion connected to a cylindrical flexible shield member described later.

A cable 9a being a first cable and a cable 9b being a second cable are inserted into the electromagnetic shield pipe 3 and exposed from the end portion of the electromagnetic shield pipe 3. That is, a plurality of cables is inserted into the interior of the electromagnetic shield pipe 3. Note that the cable 9a is, for example, a high-voltage cable, and the cable 9b is, for example, a low-voltage cable. Note that in the interior of the electromagnetic shield pipe 3, for example, the cable 9b is inserted into the cylindrical flexible shield member (not illustrated). As the cylindrical flexible shield member, a cylindrical braided wire in which a plated copper wire is braided is preferably used, and in the description below, an explanation is given by exemplifying a cylindrical braided wire as the cylindrical flexible shield member. Needless to say, the cylindrical flexible shield member is not limited to the cylindrical braided wire.

Figure 1B:
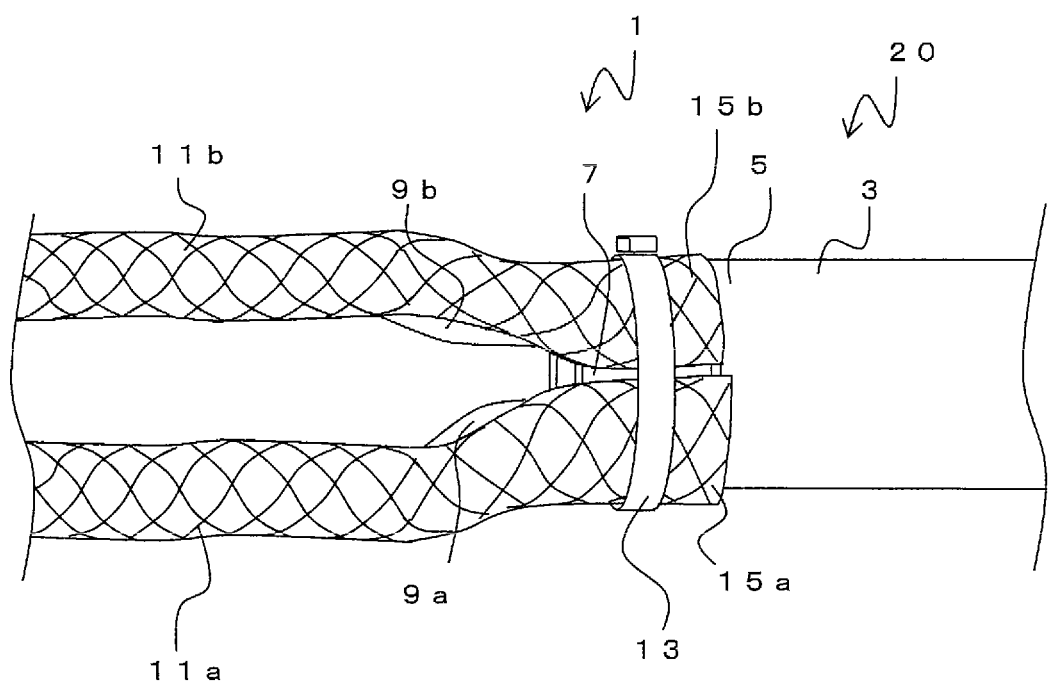
FIG. 1B is a side view illustrating an electromagnetic shield structure 1.

FIG. 1B is a side view of the electromagnetic shield structure 1 provided on the electromagnetic shield pipe 3. The electromagnetic shield structure 1 includes the electromagnetic shield pipe 3, the cables 9a and 9b, and braided wires 11a and 11b. The cylindrical braided wire 11a that is a first cylindrical flexible shield member covers the cable 9a exposed from the end portion of the electromagnetic shield pipe 3. The cylindrical braided wire 11b that is a second cylindrical flexible shield member covers the cable 9b exposed from the end portion of the electromagnetic shield pipe 3. Note that terminals (not illustrated) are connected to the end portions of the plurality of cables 9a and 9b, and used as a wire harness 20.

Figure 2A:
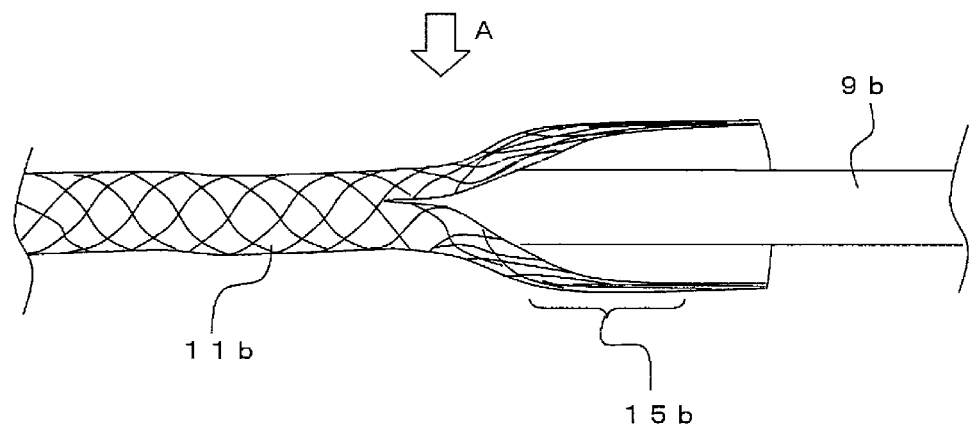
FIG. 2A is a plan view illustrating a state where a cable 9b is covered with a braided wire 11b and a view viewed from an arrow B of FIG. 2B.
Figure 2B:
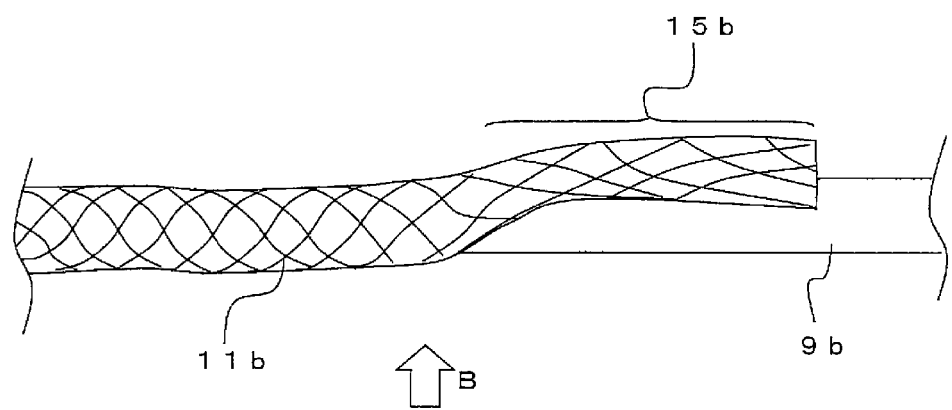
FIG. 2B is a plan view illustrating a state where the cable 9b is covered with the braided wire 11b and a view viewed from an arrow A of FIG. 2A.

FIG. 2A is a plan view of the end portion of the braided wire 11b that covers the cable 9b and a view viewed from the direction of an arrow B of FIG. 2B. FIG. 2B is a side view of the end portion of the braided wire 11b that covers the cable 9b and a view viewed from the direction of an arrow A of FIG. 2A. Note that the braided wire 11a for the cable 9a has similar form, and thus the illustration thereof will be omitted.

The cylindrical shape of the end portions (the end portions on the electromagnetic shield pipe 3 side) of the braided wires 11a and 11b is loosened and expanded. That is, the end portions of the braided wires 11a and 11b are formed in a sheet-like shape. A sheet-like portion of the end portion of the braided wire 11a is a sheet-like portion 15a. In addition, a sheet-like portion of the end portion of the braided wire 11b is a sheet-like portion 15b.

The sheet-like portion 15a of the end portion of the braided wire 11a is crimped by a crimp member 13 on an exposed portion of the metal layer 7 of the end portion of the electromagnetic shield pipe 3. Similarly, the sheet-like portion 15b of the end portion of the braided wire 11b is crimped by the same crimp member 13 on the exposed portion of the metal layer 7 of the end portion of the electromagnetic shield pipe 3. That is, the braided wire 11a and the braided wire 11b are fixed with the crimp member 13 on the outer circumference of the electromagnetic shield pipe 3 at the same position in the longitudinal direction of the electromagnetic shield pipe 3.

Figure 3A:
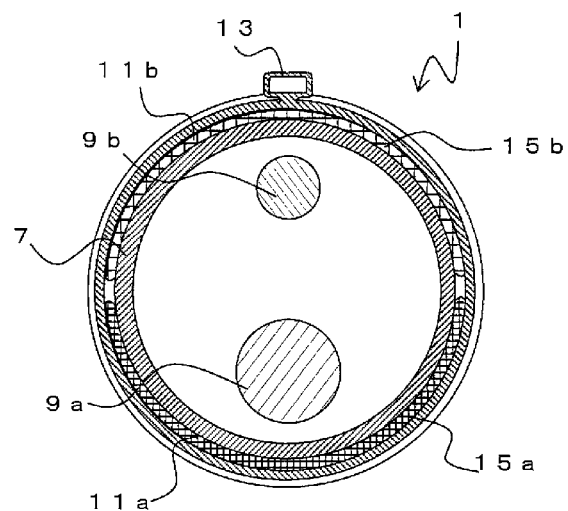
FIG. 3A is a cross-sectional view of the electromagnetic shield structure 1.

FIG. 3A is a cross-sectional view of a portion perpendicular to the longitudinal direction of the electromagnetic shield pipe 3 where the crimp member 13 is disposed. The braided wire 11a (the sheet-like portion 15a) and the braided wire 11b (the sheet-like portion 15b) are fixed with the crimp member 13 at different positions in the circumferential direction on the cross section perpendicular to the longitudinal direction of the electromagnetic shield pipe 3. In the example illustrated, the braided wire 11a is fixed in a substantially semicircle on a lower side in the circumferential direction of the electromagnetic shield pipe 3, and the braided wire 11b is fixed in another substantially semicircle (upper side in the diagram) in the circumferential direction of the electromagnetic shield pipe 3.

Figure 3B:
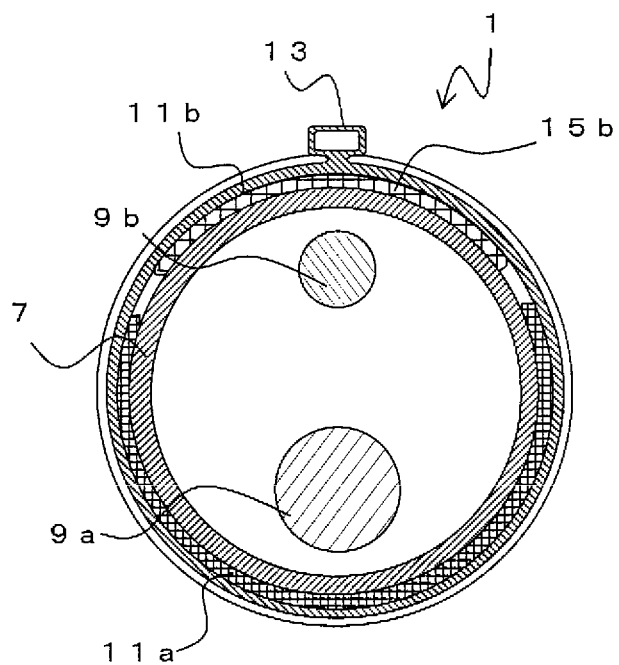
FIG. 3B is another cross-sectional view of the electromagnetic shield structure 1.

Note that, as illustrated in FIG. 3B, each of the sheet-like portion 15a of the braided wire 11a and the sheet-like portion 15b of the braided wire 11b is not required to be fixed in a substantially semicircle in the circumferential direction of the electromagnetic shield pipe 3. For example, when the circumferential length of the braided wire 11a is greater than the circumferential length of the braided wire 11b, the width of the sheet-like portion 15a may be wider than the width of the sheet-like portion 15b.

As described above, the cylindrical end portions of the braided wires 11a and 11b are loosened, and each of the sheet-like portions 15a and 15b is formed on the end portion. The sheet-like portions 15a and 15b of the end portions of the braided wires 11a and 11b are disposed at different positions in the circumferential direction of the electromagnetic shield pipe 3 and fixed on the metal layer 7 of the electromagnetic shield pipe 3 with the crimp member 13. Thus, in the cross section perpendicular to the longitudinal direction of the electromagnetic shield pipe 3, the braided wires 11a and 11b in a portion crimped by the crimp member 13 are fixed without being overlapped with each other in the circumferential direction of the electromagnetic shield pipe 3.

That is, each of the plurality of braided wires 11a and 11b is fixed with the crimp member 13 on the outer circumference of the electromagnetic shield pipe 3. In this case, the entire outer circumferential surface of each of the plurality of braided wires 11a and 11b is pressed by the crimp member 13 from the outer circumferential side, in the portion where the crimp member 13 is disposed on the cross section perpendicular to the longitudinal direction of the electromagnetic shield pipe 3. That is, the portion where the crimp member 13 is disposed in the longitudinal direction of the electromagnetic shield pipe 3 serves as a crimp portion where the braided wires 11a and 11b are pressed from the outer circumference.

Note that "each of the entire outer circumferential surfaces is pressed by the crimp member 13 from the outer circumferential side" means that the entire outer circumferential surfaces of all the braided wires 11a and 11b are directly or indirectly pressed by the crimp member 13 from the outer circumferential side. For example, when the braided wires 11a and 11b are overlapped with each other, and a step occurs in this part in the circumferential direction, a section to which pressing force generated by tightening by the crimp member 13 from the outer circumferential side is not transmitted occurs in a part of any of the braided wires 11a and 11b on both sides of the step. In the present invention, the section to which this pressing force is not transmitted does not occur. That is, in the present invention, no gap occurs between the part of the outer circumferential surface of the braided wires 11a and 11b and the crimp member 13 disposed on the outer circumferential side of the braided wires 11a and 11b (or another member disposed between the crimp member 13 and each braided wire). Thus, the entire outer circumferential surface of the braided wires 11a and 11b is adhered to members disposed on the outer circumferential side of the braided wires 11a and 11b. Note that this "gap" does not include a minuscule gap caused by depressions and recesses on the outer surface of the braided wires 11a and 11b between the braided wires and the crimp member 13 or the like. Note that, considering that the pressing force from the outer circumferential side is appropriately transmitted to each of the braided wires 11a and 11b in the case when each of the braided wires 11a and 11b is crimped by the crimp member 13, it is preferable that the thicknesses of the sheet-like portions 15a and 15b in the portion where the crimp member 13 is disposed are substantially equal.

Figure 4:
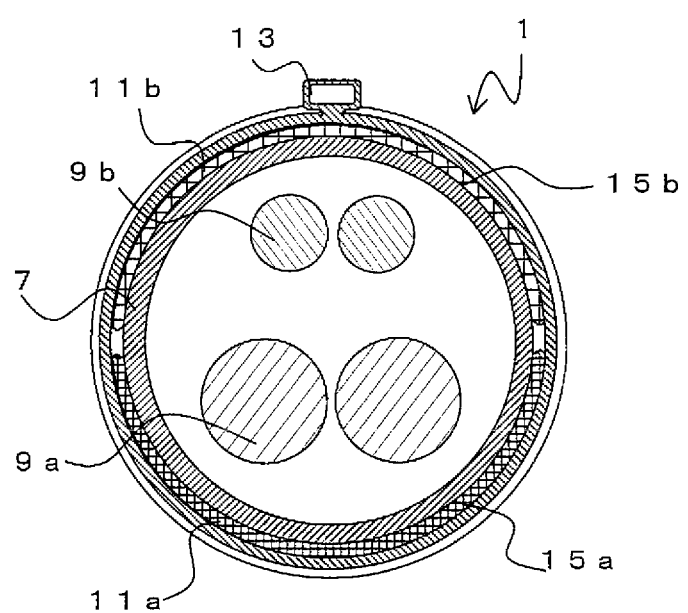
FIG. 4 is another cross-sectional view of the electromagnetic shield structure 1.

Note that the number of cables inserted into the electromagnetic shield pipe 3 is not limited to two. For example, as illustrated in FIG. 4, the cables 9a and 9b may be not one, but may be a plurality. Even in this case, the cables 9a and 9b exposed from the electromagnetic shield pipe 3 are respectively covered with the braided wires 11a and 11b and, the braided wires 11a and 11b are crimped at different positions in the circumferential direction.

In this case, the plurality of cables may be inserted into one braided wire, or different braided wire may be used for each cable. Even in this case, respective braided wires are disposed not to be overlapped with each other in a crimp portion. For example, the cable 9a is a high-voltage system cable, and the cable 9b is a low-voltage system cable, and when cables are two systems, one system cable may be inserted into one braided wire. Note that, in many cases, both the number of high-voltage system cables and the number of low-voltage system cables are normally two or more. Thus, the high-voltage system cables and the low-voltage system cables are inserted into the braided wire for each system, thereby achieving shielding between the high-voltage system cables and the low-voltage system cables, between the electromagnetic shield pipe 3 and a connector.

In addition, the cables inserted into the electromagnetic shield pipe 3 are not limited to the two systems of the cables 9a and 9b. For example, when the cables inserted into the electromagnetic shield pipe 3 are three or more systems, or when a three-phase alternating current wire is provided, three or more braided wires may be used, and the sheet-like portions of the end portions of respective braided wires are only required to be disposed in such a manner so as not to be overlapped with each other at different positions in the circumferential direction of the electromagnetic shield pipe 3.

Figure 5A:
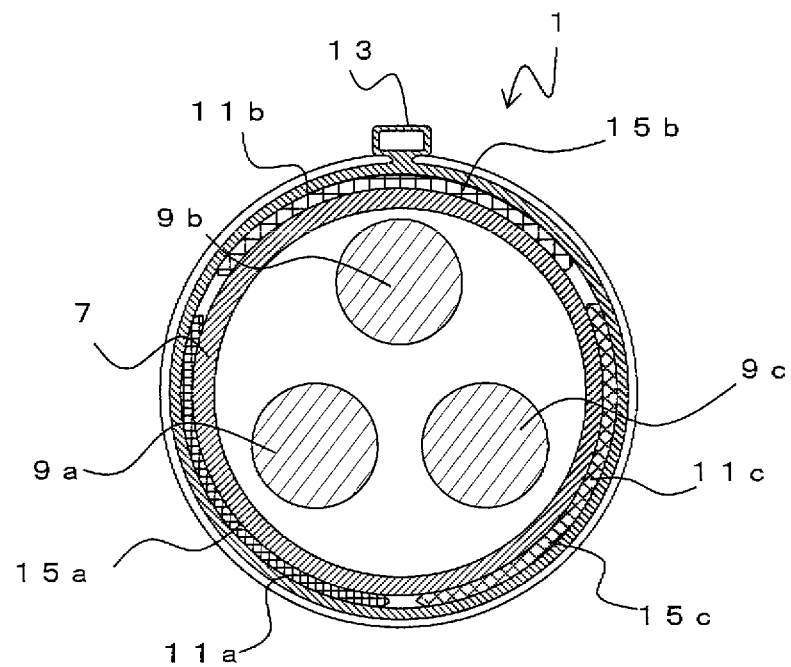
FIG. 5A is another cross-sectional view of the electromagnetic shield structure 1.

For example, as illustrated in FIG. 5A, when three cables 9a, 9b and 9c are inserted into the electromagnetic shield pipe 3, the cables 9a, 9b and 9c are covered with braided wires 11a, 11b, and 11c, respectively, and the braided wires 11a, 11b, and 11c are fixed at different positions in the circumferential direction. In this case, sheet-like portions 15a, 15b, and 15c are formed at respective end portions of the cylindrical braided wires 11a, 11b, and 11c, and the respective sheet-like portions 15a, 15b, and 15c are fixed on the metal layer 7 of the electromagnetic shield pipe 3 at different positions in the circumferential direction of the electromagnetic shield pipe 3.

Figure 5B:
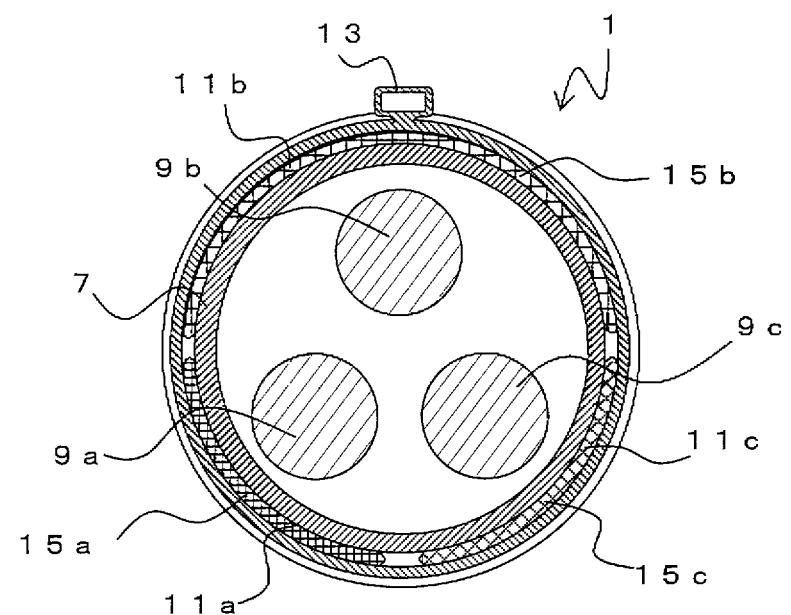
FIG. 5B is another cross-sectional view of the electromagnetic shield structure 1.

In this case, as illustrated in FIG. 5A, the circumferential length of the sheet-like portions 15a, 15b, and 15c (the braided wires 11a, 11b, and 11c) may be substantially equally divided and disposed in such a manner so as to be one third of the length of the circumferential direction. Alternatively, as illustrated in FIG. 5B, the sheet-like portions 15a, 15b, and 15c (the braided wires 11a, 11b, and 11c) may be disposed in such a manner that the lengths of the circumferential direction are different from each other. In any case, on the cross section perpendicular to the longitudinal direction of the electromagnetic shield pipe 3, the entire outer circumferential surface of each of the braided wires 11a, 11b, and 11c is pressed by the crimp member 13 from the outer circumferential side. Note that in the description below, an explanation is given as to a case where two cables 9a and 9b are included, but in other embodiments, three or more cables may be included. In addition, considering that the pressing force from the outer circumferential side is appropriately transmitted to each of the braided wire 11a, 11b, and 11c in the case when each of the braided wire 11a, 11b, and 11c is tighten by the crimp member 13, it is preferable that the thicknesses of the sheet-like portions 15a, 15b, and 15c in the portion where the crimp member 13 is disposed are substantially equal.

Next, a manufacturing method of the electromagnetic shield structure 1 will be described. First, the metal layer 7 of the end portion of the electromagnetic shield pipe 3 is exposed. In addition, the cables 9a and 9b are inserted into the electromagnetic shield pipe 3. Note that, in this case, a braided wire may be disposed on the outer circumference of the cable 9a or the cable 9b in the interior of the electromagnetic shield pipe 3.

Subsequently, the cable 9a exposed from the electromagnetic shield pipe 3 is covered with the braided wire 11a. In this case, the cylindrical portion of the end portion of the braided wire 11a (on the electromagnetic shield pipe 3 side) is loosened, and the sheet-like portion 15a having a predetermined length is formed. Similarly, the cable 9b exposed from the electromagnetic shield pipe 3 is covered with the braided wire 11b. In this case, the cylindrical portion of the end portion of the braided wire 11b (on the electromagnetic shield pipe 3 side) is loosened, and the sheet-like portion 15b having a predetermined length is formed.

Subsequently, the sheet-like portions 15a and 15b of the end portions of the braided wires 11a and 11b are disposed on the outer circumference of the metal layer 7. In this case, the sheet-like portions 15a and 15b are disposed at different positions in the circumferential direction of the electromagnetic shield pipe 3 so as not to be overlapped with each other. In this state, the braided wires 11a and 11b are crimped and fixed with the crimp member 13 on the electromagnetic shield pipe 3. Note that the end portion (crimp portion) of the electromagnetic shield pipe 3 is covered with a rubber member or the like as appropriate. As described above, the electromagnetic shield structure 1 is formed.

Hereinbefore, according to the First Embodiment, the braided wires 11a and 11b are crimped without being overlapped with each other at different positions in the circumferential direction of the electromagnetic shield pipe 3 in the crimp portion. Thus, there is no change in thickness in the crimp portion due to the partial overlapping of the braided wires 11a and 11b. Consequently, in the portion where the crimp member 13 is disposed, the entire outer circumferential surface of each of the braided wires 11a and 11b is pressed by the crimp member 13 from the outer circumferential side, and the stable holding strength by the crimp member 13 can be secured.

In addition, the braided wires 11a and 11b are respectively disposed in substantially semicircles in the circumferential direction of the electromagnetic shield pipe 3, thereby respectively securing a sufficient contact area.

Second Embodiment

Figure 6A:
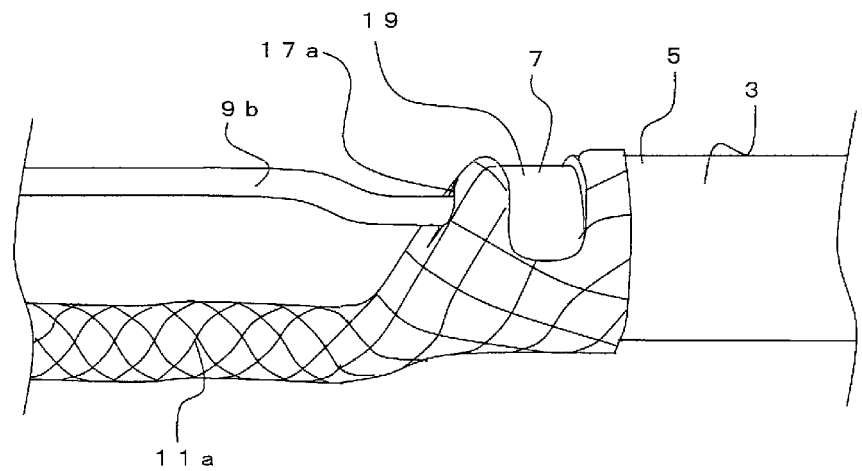
Figure 6B:
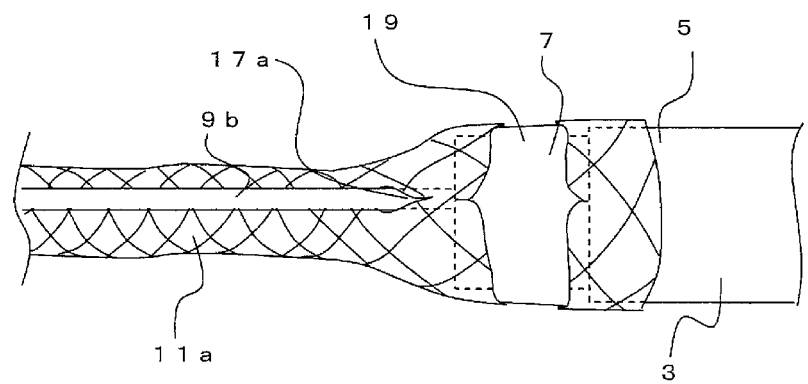

Next, a Second Embodiment will be described. FIGS. 6A and 6B are views illustrating processes for forming an electromagnetic shield structure according to the Second Embodiment, and FIG. 6A is a side view, and FIG. 6B is a plan view. Note that, in the description below, constituent elements which have the same effect will be assigned the same reference numerals as in FIG. 1B and other drawings, and redundant descriptions of those constituent elements will be omitted.

In the present embodiment, first, the cable 9a exposed from the electromagnetic shield pipe 3 is inserted into the braided wire 11a. The end portion of the braided wire 11a covers the end portion (the metal layer 7) of the electromagnetic shield pipe 3 while being formed in a cylindrical shape. Thus, in the present embodiment, which is different from the embodiment described above, it is not required to form the sheet-like portion 15a in the end portion of the braided wire 11a.

Note that the stitches of the braided wire 11a can be easily expanded, so that the diameter of the cylinder can be easily increased while the cylindrical shape is maintained. Thus, even when the braided wire 11a in accordance with the size of the cable 9a is used, the end portion of the braided wire 11a can be expanded to cover the outer circumference of the electromagnetic shield pipe 3.

The holes 17a and 19 are formed in part of the braided wire 11a. Note that the hole 17a and the hole 19 are formed in the substantially same direction as the circumferential direction of the braided wire 11a. The holes 17a and 19 are formed by expanding the metallic elemental wires of the braided wire 11a to both sides. The hole 17a is formed on the base portion side of the braided wire 11a with respect to a portion that covers the electromagnetic shield pipe 3. The hole 17a is a portion penetrated by the cable 9b. Thus, when the cable 9a is inserted from the end portion of the braided wire 11a, the cable 9b is also simultaneously inserted into the braided wire 11a, and the cable 9b is taken out from the hole 17a to the outside.

The hole 19 is formed on the end portion side of the braided wire 11a with respect to the hole 17a. That is, the hole 19 is formed in a portion of the braided wire 11a, the portion that covers the electromagnetic shield pipe 3. More specifically, as illustrated, the braided wire 11a covers the end portion of the electromagnetic shield pipe 3 in such a manner so that the hole 19 is positioned at the metal layer 7. Note that the hole 17a and the hole 19 may communicate with each other.

Figure 7A:
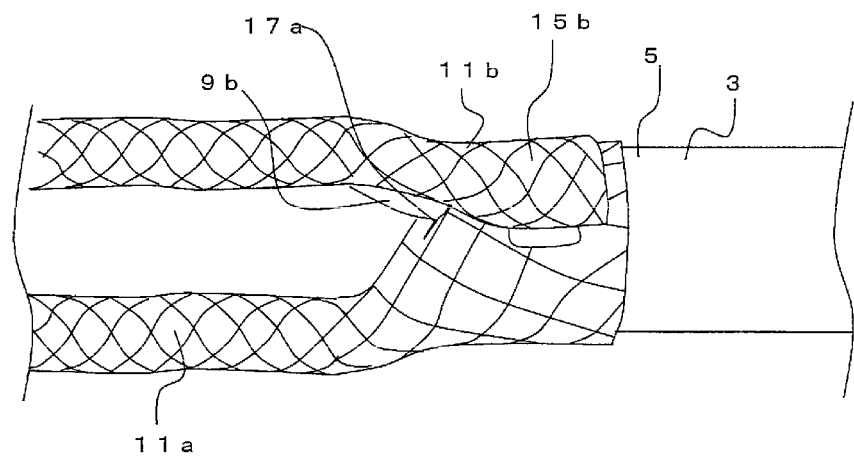
FIG. 7A is a side view illustrating a state where the cable 9b is covered with the braided wire 11b.
Figure 7B:
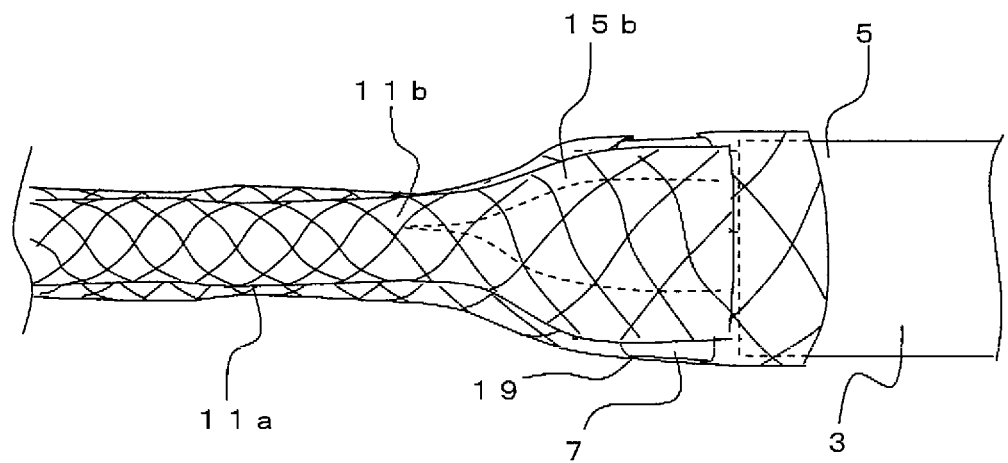
FIG. 7B is a plan view illustrating a state where the cable 9b is covered with the braided wire 11b.

FIG. 7A and FIG. 7B are views illustrating a state where the cable 9b is further covered with the braided wire 11b, and FIG. 7A is a side view, and FIG. 7B is a plan view. The sheet-like portion 15b is formed in the end portion of the braided wire 11b. That is, the cylindrical braided wire 11b is disposed on the cable 9b exposed from the braided wire 11a, and the sheet-like portion 15b is disposed so as to be overlapped with the braided wire 11a.

In this case, part of the sheet-like portion 15b is overlapped at a position of the hole 19 of the braided wire 11a. Thus, a part of the sheet-like portion 15b is disposed so as to cover the metal layer 7 exposed from the hole 19. In this case, the width of the braided wire 11b is narrower that the width of the hole 19. This prevents the braided wire 11b from protruding from the hole 19 and from being overlapped with the braided wire 11a in the circumferential direction of the hole 19.

Figure 8:
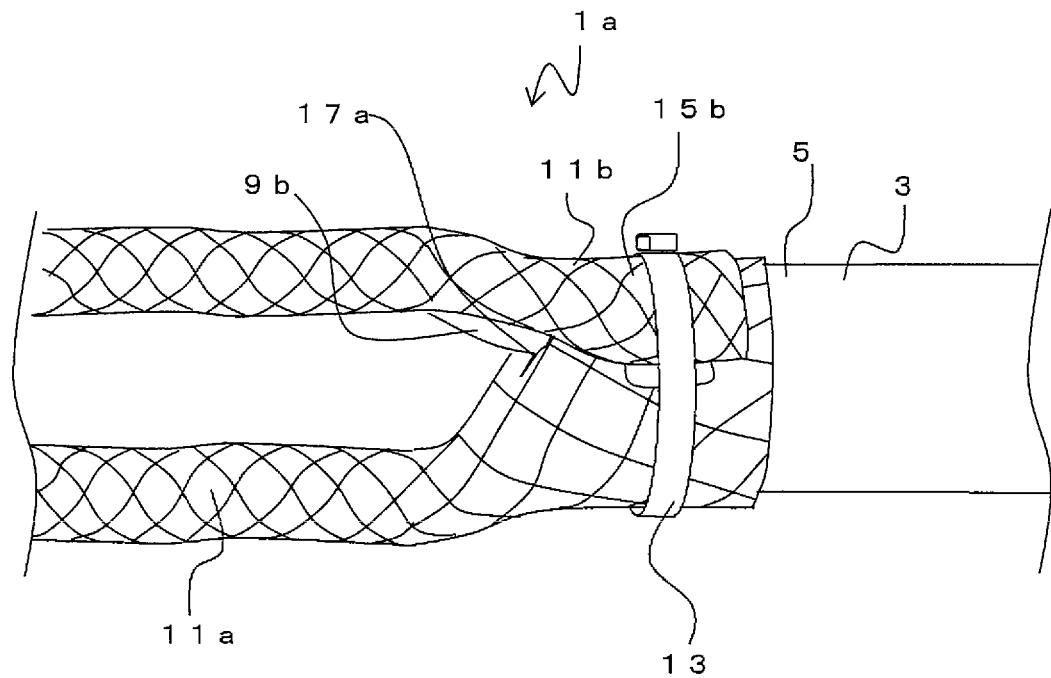
Figure 9:
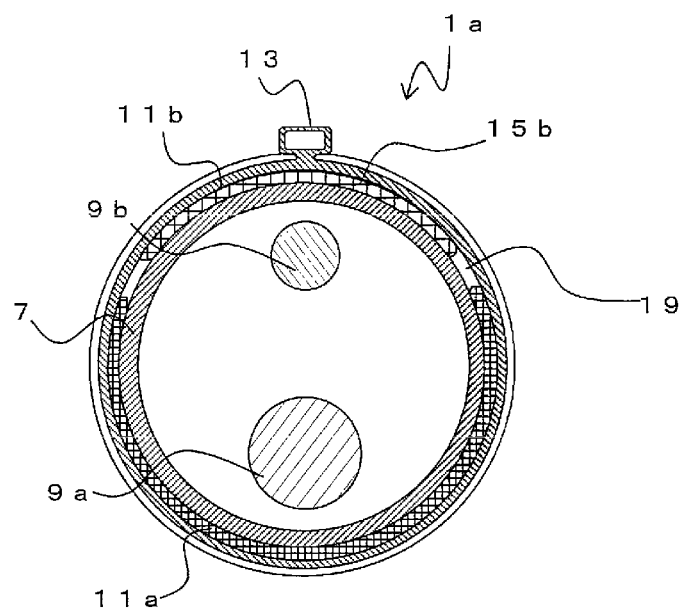

Further, FIG. 8 is a view illustrating an electromagnetic shield structure 1a in which the braided wires 11a and 11b are fixed with the crimp member 13, and FIG. 9 is a cross-sectional view of a portion where the crimp member 13 is disposed. As illustrated, the braided wires 11a and 11b are fixed with the crimp member 13 on the electromagnetic shield pipe 3 in the portion where the crimp member 13 is disposed, corresponding to the hole 19.

As described above, the end portion of the braided wire 11a covers the outer circumference of the electromagnetic shield pipe 3 while being in a cylindrical shape. In addition, the hole 19 is provided in part of the braided wire 11a positioned on the outer circumference of the electromagnetic shield pipe 3, and the sheet-like portion 15b of the end portion of the braided wire 11b covers the position of the hole 19. Further, the braided wires 11a and 11b are fixed with the crimp member 13 on the electromagnetic shield pipe 3 in a portion in the circumferential direction corresponding to the hole 19. This prevents the braided wires 11a and 11b from being partially overlapped with the outer circumference of the electromagnetic shield pipe 3 in the crimp portion.

According to the Second Embodiment, the same effect as that of the First Embodiment can be achieved. That is, by removing the partial overlapping of the braided wires 11a and 11b in the crimp portion, the entire outer circumferential surface of each of the braided wires 11a and 11b is pressed by the crimp member 13 from the outer circumferential side, and the stability of holding strength or the stability of an energized state can be obtained.

In addition, the hole 19 is provided in the braided wire 11a, which makes it unnecessary to loosen the end portion of the braided wire 11a and form the sheet-like portion 15a. Note that, even in this case, the braided wires 11a and 11b can be appropriately disposed by adjusting the size of the hole 19 in such a manner as to cover each of substantially semicircles of the electromagnetic shield pipe 3. Note that considering that the pressing force from the outer circumferential side is appropriately transmitted to each of the braided wires 11a and 11b in the case where each of the braided wires 11a and 11b is tightened by the crimp member 13, it is preferable that the thickness of the braided wire 11a and the thickness of the sheet-like portion 15b in the portion where the crimp member 13 is disposed are substantially equal.

Third Embodiment

Figure 10A:
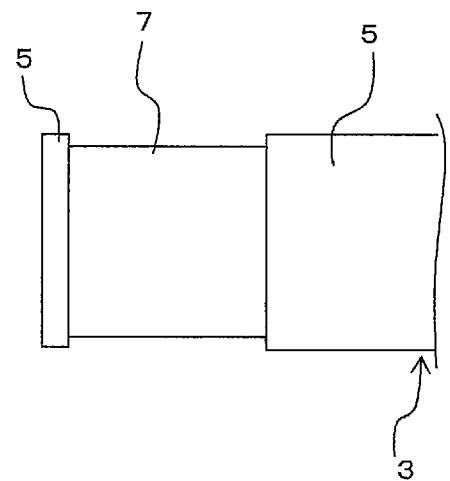
FIG. 10A is a side view illustrating the electromagnetic shield pipe 3 of another embodiment.
Figure 10B:
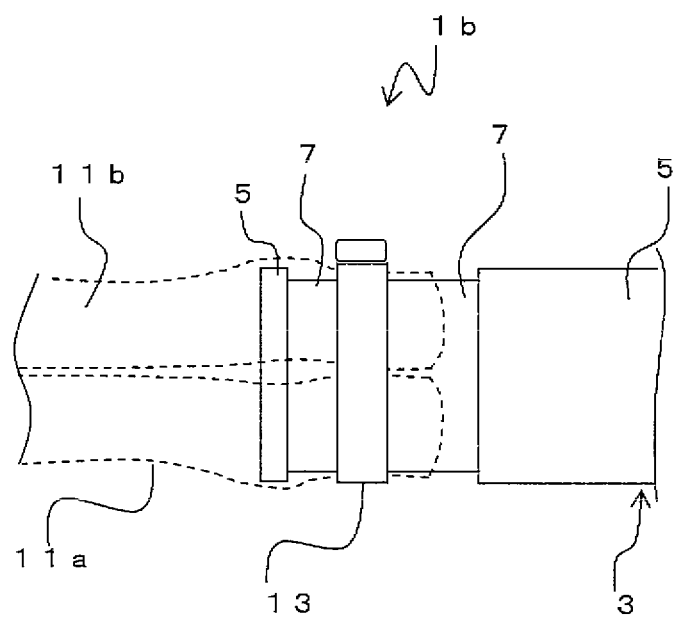
FIG. 10B is a side view illustrating an electromagnetic shield structure 1b.

Next, a Third Embodiment will be described. FIG. 10A is a side view illustrating an electromagnetic shield pipe 3, and FIG. 10B is a side view illustrating an electromagnetic shield structure 1b according to the Third Embodiment. Note that FIG. 10B is a perspective view of the braided wires 11a and 11b, and the illustration of cables is omitted.

In the present embodiment, the outer layer 5 in the vicinity of the end portion of the electromagnetic shield pipe 3 is not entirely removed, but the outer layer 5 remains in an annular shape in part of the tip end portion. That is, the exposed portion of the metal layer 7 is caught by the outer layers 5 and formed in an annular shape.

As illustrated in FIG. 10B, the braided wires 11a and 11b are crimped by the crimp member 13 on the metal layer 7 in such a manner that the braided wires 11a and 11b are not overlapped with each other. Thus, the braided wires 11a and 11b steadily comes in contact with the metal layer 7, which leads to electrical conduction. Note that the arrangement of the braided wires 11a and 11b can have any form as long as the partial overlapping is eliminated.

In this case, the annular outer layer 5 on the tip end side is positioned on the tip end side with respect to a crimping position of the crimp member 13. The outer layer 5 has a larger outer diameter than that of the exposed portion of the metal layer 7. Thus, a large diameter portion formed by the annular outer layer 5 is provided on the tip end side of the crimping position of the crimp member 13 with respect to the electromagnetic shield pipe 3. Thus, even when the braided wires 11a and 11b are pulled, and the crimp member 13 is shifted to the tip end side, the movement of the crimp member 13 is regulated by the outer layer 5. Consequently, the crimp member 13 can be prevented from coming off from the electromagnetic shield pipe 3.

According to the Third Embodiment, the same effect as that of the First Embodiment can be achieved. That is, by removing the partial overlapping of the braided wires 11a and 11b in the portion where the crimp member 13 is disposed, the entire outer circumferential surface of each of the braided wires 11a and 11b is pressed by the crimp member 13 from the outer circumferential side, and the stability of holding strength or the stability of an energized state can be obtained. Note that, considering that the pressing force from the outer circumferential side is appropriately transmitted to each of the braided wires 11a and 11b in the case where each of the braided wires 11a and 11b is tighten by the crimp member 13, it is preferable that the thicknesses of the sheet-like portions 15a and 15b in the portion where the crimp member 13 is disposed are substantially equal.

In addition, the outer layer 5 provided in an annular form functions as a stopper for preventing the crimp member 13 from coming off, so that the outer layer 5 can prevent the crimp member 13 from coming off from the electromagnetic shield pipe 3. Note that, in place of the outer layer 5, another member such as resin may be adhered to the outer circumferential portion of the metal layer 7 in an annular form, thereby forming a large diameter portion on the tip end side of the crimping position.

Fourth Embodiment

Figure 11A:
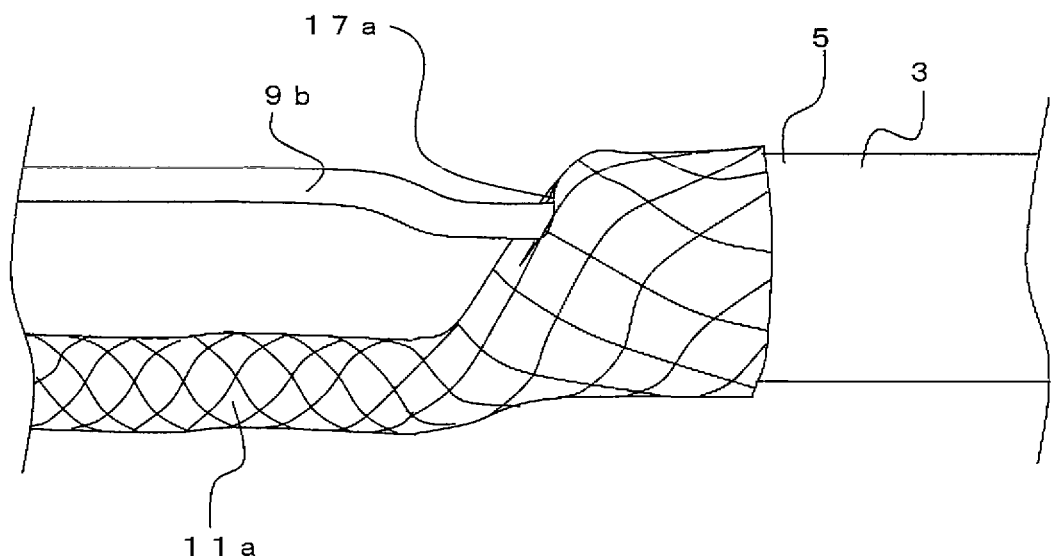
Figure 11B:
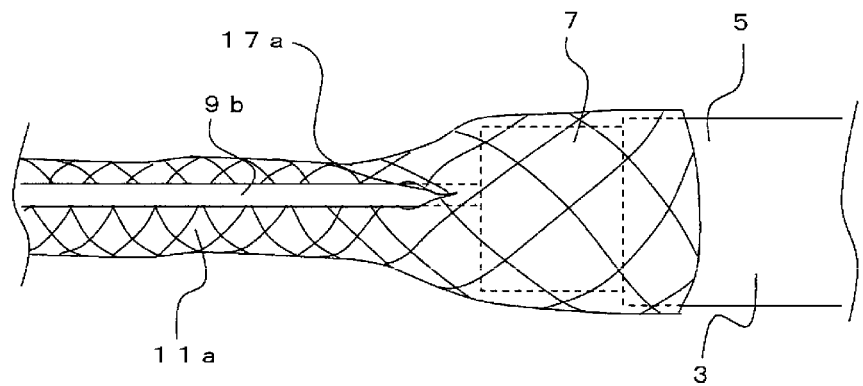

Next, a Fourth Embodiment will be described. FIG. 11A and FIG. 11B are views illustrating processes for forming an electromagnetic shield structure according to the Fourth Embodiment, and FIG. 11A is a side view, and FIG. 11B is a plan view.

In the Fourth Embodiment, as is the case with the Second Embodiment, first, the cable 9a exposed from the electromagnetic shield pipe 3 is inserted into the braided wire 11a. Note that, as is the case with the Third Embodiment, the outer layer 5 may be provided on the tip end portion of the electromagnetic shield pipe 3. The end portion of the braided wire 11a covers the end portion (the metal layer 7) of the electromagnetic shield pipe 3 while being in a cylindrical shape.

The hole 17a is formed in part of the braided wire 11a. As described above, the hole 17a is a portion penetrated by the cable 9b. Thus, when the cable 9a is inserted into the braided wire 11a, the cable 9b is also inserted into the braided wire 11a and taken out from the hole 17a to the outside. Note that the hole 17a may be formed by opening the cylindrical shape of the braided wire 11a.

Figure 12A:
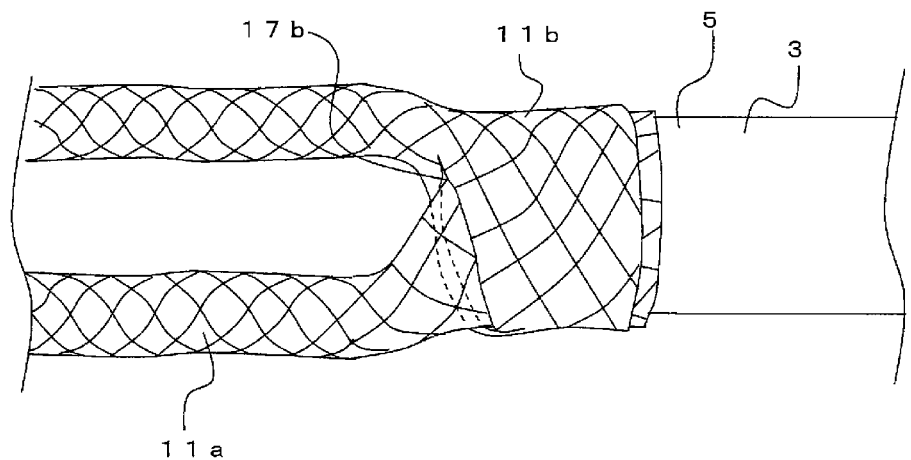
FIG. 12A is a side view illustrating a state where the cable 9b is covered with the braided wire 11b.
Figure 12B:
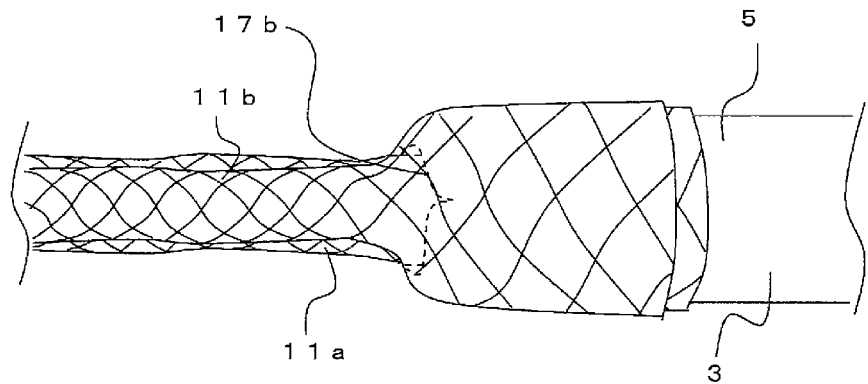
FIG. 12B is a plan view illustrating a state where the cable 9b is covered with the braided wire 11b.

Further, FIG. 12A and FIG. 12B are views illustrating a state where the cable 9b is covered with the braided wire 11b, and FIG. 12A is a side view, and FIG. 12B is a plan view. The sheet-like portion 15b is not formed at the end portion of the braided wire 11b which is in a cylindrical shape. A hole 17b penetrated by the braided wire 11a (the cable 9a) is formed in the braided wire 11b. Note that the hole 17b may be formed by opening the cylindrical shape of the braided wire 11b.

In this case, first, both the braided wire 11a (the cable 9a) and the cable 9b are inserted from the end portion of the braided wire 11b, and only the braided wire 11a (the cable 9a) is taken out from the hole 17b to the outside of the braided wire 11b, and the cable 9b may be inserted into the braided wire 11b as it is.

The end portion of the braided wire 11b covers the end portion of the electromagnetic shield pipe 3 together with the braided wire 11a. That is, on the outer circumference of the metal layer 7 of the electromagnetic shield pipe 3, the braided wire 11a is disposed across the entire circumference, and on the outer circumference of the braided wire 11a, the braided wire 11b is disposed across substantially the entire circumference.

Figure 13:
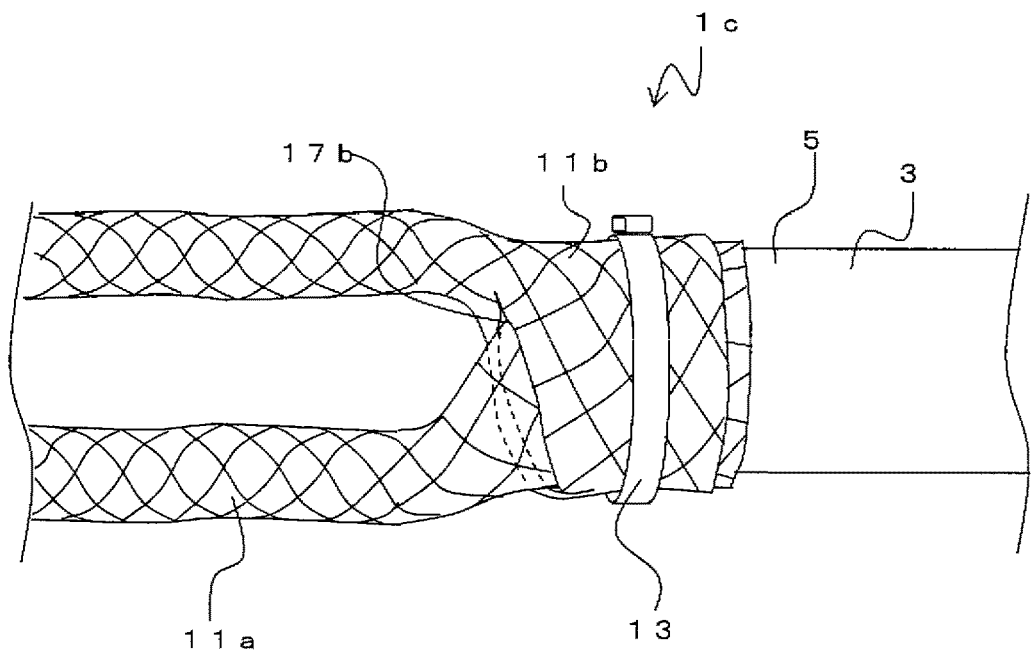
FIG. 13 is a side view illustrating an electromagnetic shield structure 1c.
Figure 14:
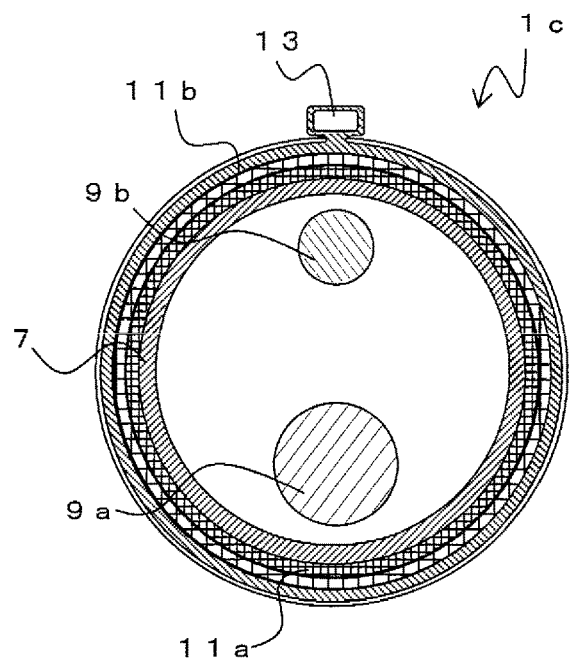
FIG. 14 is a cross-sectional view illustrating the electromagnetic shield structure 1c.

Further, FIG. 13 is a view illustrating an electromagnetic shield structure 1c in which the braided wires 11a and 11b are fixed with the crimp member 13, and FIG. 14 is a cross-sectional view of the crimp portion. As illustrated, on the metal layer 7, the braided wires 11a and 11b are fixed with the crimp member 13 on the electromagnetic shield pipe 3.

As described above, the end portions of the braided wires 11a and 11b cover the outer circumference of the electromagnetic shield pipe 3 while being in a cylindrical shape. In this case, the cylindrical braided wires 11a and 11b are disposed across the entire circumference of the electromagnetic shield pipe 3, so that the braided wires 11a and 11b are overlapped with each other across the entire outer circumference of the electromagnetic shield pipe 3 in the crimp portion. That is, the overlapping portion of the braided wires 11a and 11b is not partially formed in the circumferential direction of the electromagnetic shield pipe 3, but the braided wires 11a and 11b are overlapped with each other across the entire circumference. Thus, there is no change in the thickness of the braided wires in the crimp portion.

According to the Fourth Embodiment, the same effect as that of the First Embodiment can be achieved. That is, a step due to the partial overlapping of the braided wires 11a and 11b is not formed in the crimp portion. Thus, in the portion where the crimp member 13 is disposed, the entire outer circumferential surface of the braided wire 11b is pressed by the crimp member 13 from the outer circumferential side, and the entire outer circumferential surface of the braided wire 11a is indirectly pressed by the crimp member 13 via the braided wire 11b from the outer circumferential side, so that the stability of holding strength or the stability of an energized state can be obtained. Note that, considering that the pressing force from the outer circumferential side is appropriately transmitted to each of the braided wires 11a and 11b in the case where each of the braided wires 11a and 11b is tighten by the crimp member 13, it is preferable that the thicknesses of the braided wires 11a and 11b in the portion where the crimp member 13 is disposed are not substantially changed in the respective circumferential directions.

Thus, in the present invention, both the braided wires 11a and 11b are overlapped with each other across the entire circumference, so that change in the thicknesses of the braided wires can be prevented in the crimp portion. Consequently, an influence caused by a step portion due to the partial overlapping of the braided wires is suppressed.

Fifth Embodiment

Figure 15A:
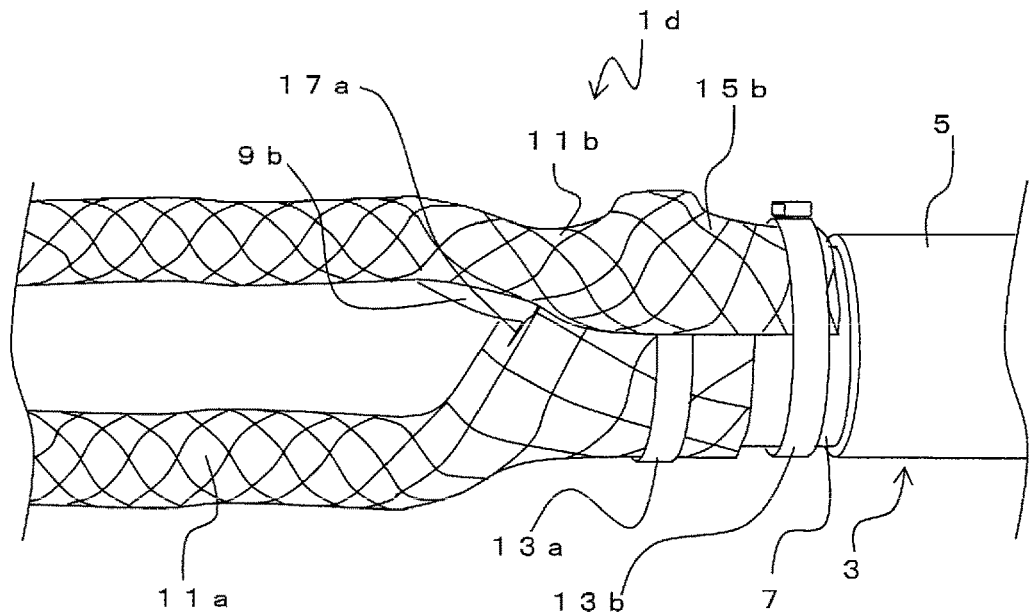
FIG. 15A is a side view illustrating an electromagnetic shield structure 1d.
Figure 15B:
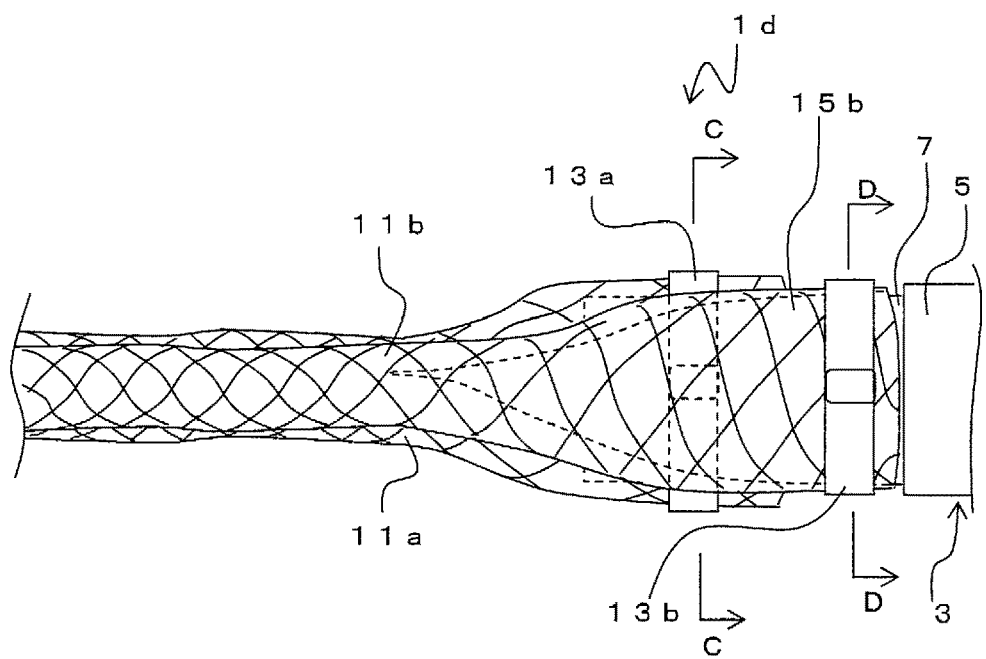
FIG. 15B is a plan view illustrating the electromagnetic shield structure 1d.

Next, a Fifth Embodiment will be described. FIG. 15A is a side view illustrating an electromagnetic shield structure 1d provided on the electromagnetic shield pipe 3, and FIG. 15B is a plan view. The electromagnetic shield structure 1d includes the electromagnetic shield pipe 3, the cables 9a and 9b, the braided wires 11a and 11b, crimp members 13a and 13b, and the like.

The end portion of the braided wire 11a covers the outer circumference of the metal layer 7 of the end portion of the electromagnetic shield pipe 3 while being in a cylindrical shape. The braided wire 11a is fixed with the crimp member 13a on the outer circumference of the electromagnetic shield pipe 3. In contrast, the end portion of the braided wire 11b is disposed on the outer circumference of the braided wire 11a and the crimp member 13a.

The sheet-like portion 15b of the end portion of the braided wire 11b is disposed on the base portion side with respect to the braided wire 11a and crimped by the crimp member 13b on the exposed portion of the metal layer 7 of the end portion of the electromagnetic shield pipe 3. That is, the braided wire 11a and the braided wire 11b are fixed with the crimp members 13a and 13b on the outer circumference of the electromagnetic shield pipe 3 at different positions in the longitudinal direction of the electromagnetic shield pipe 3. In the example illustrated, the braided wire 11a is fixed with the crimp member 13a on the end portion side of the electromagnetic shield pipe 3, and the braided wire 11b is fixed with the crimp member 13b through the outer circumference of the crimp member 13a on the base portion side of the electromagnetic shield pipe 3.

Figure 16A:
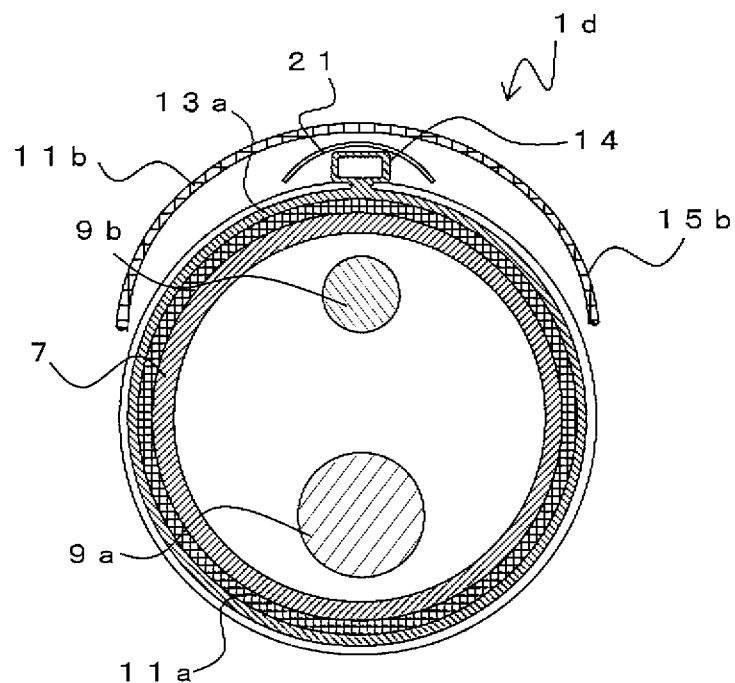
FIG. 16A is a cross-sectional view of a portion of a crimp member 13a of the electromagnetic shield structure 1d.
Figure 16B:
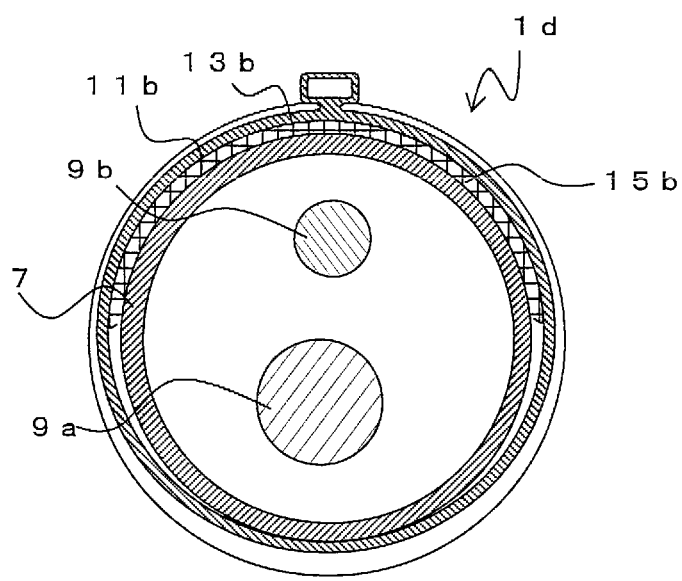
FIG. 16B is a cross-sectional view of a portion of a crimp member 13b of the electromagnetic shield structure 1d.

FIG. 16A is a cross-sectional view taken along line C-C of FIG. 15B, and FIG. 16B is a cross-sectional view taken along line D-D of FIG. 15B. On the cross section perpendicular to the longitudinal direction of the electromagnetic shield pipe 3, the braided wire 11a is crimped and fixed with the crimp member 13a. In the example illustrated, the braided wire 11a is fixed across the entire circumference in the circumferential direction of the electromagnetic shield pipe 3. In this case, a gap is formed between the braided wire 11a and the outer layer 5. That is, the metal layer 7 is exposed on the tip end side of the braided wire 11a. In addition, a head portion 14 is provided on the crimp members 13a and 13b. The head portion 14 is a protruding portion that protrudes to the outside on the crimp members 13a and 13b. The protruding portion has a linear, bent, or folded shape, for example. Note that, as for the crimp members 13a and 13b illustrated in FIG. 16A and FIG. 16B, an example in which the base of the head portion 14, which is the protruding portion, is tightened and has a folded shape is given.

The sheet-like portion 15b of the end portion of the braided wire 11b covers the outer circumference of the crimp member 13a, and the vicinity of the end portion of the sheet-like portion 15b is disposed on the outer circumference of the metal layer 7 exposed from the tip end of the braided wire 11a and fixed with the crimp member 13b. In the example illustrated, the braided wire 11b is fixed on a substantially semicircle on an upper side in the circumferential direction of the electromagnetic shield pipe 3. Note that in FIG. 15A, FIG. 15B, and FIG. 16A, the braided wire 11a is disposed on the outer circumference of the electromagnetic shield pipe 3 while being in a cylindrical shape, but the arrangement of the braided wire 11a is not limited to this. For example, a sheet-like portion having the same shape as that of the sheet-like portion 15b may be provided in the end portion of the braided wire 11a and disposed on a substantially semicircle in the circumferential direction of the electromagnetic shield pipe 3.

Thus, the braided wires 11a and 11b are disposed at different positions in the longitudinal direction of the electromagnetic shield pipe 3 and fixed with the crimp members 13a and 13b on the metal layer 7 of the electromagnetic shield pipe 3, respectively. That is, the braided wires 11a and 11b are crimped and fixed with the respective crimp members 13a and 13b of the electromagnetic shield pipe 3 without being overlapped in the portion where the crimp members 13a and 13b are disposed.

Note that, as described above, the braided wire 11b is arranged from the end portion side to the base portion side of the electromagnetic shield pipe 3 through the outside of the head portion 14 of the crimp member 13a, and thus there are concerns about the damage of the braided wire 11b due to the contact with the head portion 14, depending on the arrangement of the braided wire 11b. Thus, a protective member 21 may be disposed between the braided wire 11b disposed outside and the head portion 14. That is, in the case where the braided wire 11a is fixed with the crimp member 13a on the end portion side of the electromagnetic shield pipe 3, and the braided wire 11b is fixed with the crimp member 13b through the outer circumference of the crimp member 13a on the base portion side of the electromagnetic shield pipe 3, the protective member 21 may be provided between the crimp member 13a and the braided wire 11b. For example, the protective member 21 can use the same material as that of the braided wires 11a and 11b.

Note that the arrangement in the circumferential direction of the braided wire 11b (the sheet-like portion 15b) may be applied to a position different from that of the head portion 14 in order to avoid the contact between the braided wire 11b and the head portion 14. That is, in the case where the braided wire 11a is fixed with the crimp member 13a on the end portion side of the electromagnetic shield pipe 3, and the braided wire 11b is fixed with the crimp member 13b through the outer circumference of the crimp member 13a on the base portion side of the electromagnetic shield pipe 3, the braided wire 11b is disposed so as to avoid the head portion 14 of the crimp member 13a.

Figure 17A:
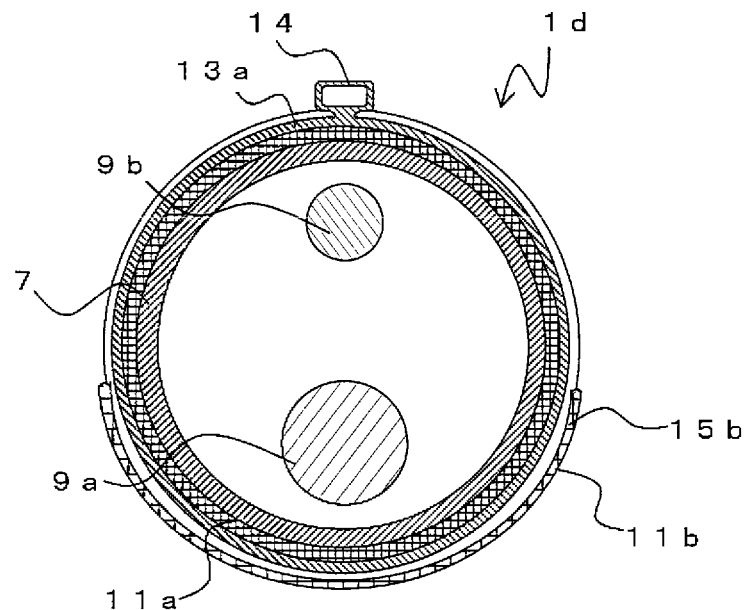
FIG. 17A is a cross-sectional view of the portion of a crimp member 13a of another embodiment of the electromagnetic shield structure 1d.
Figure 17B:
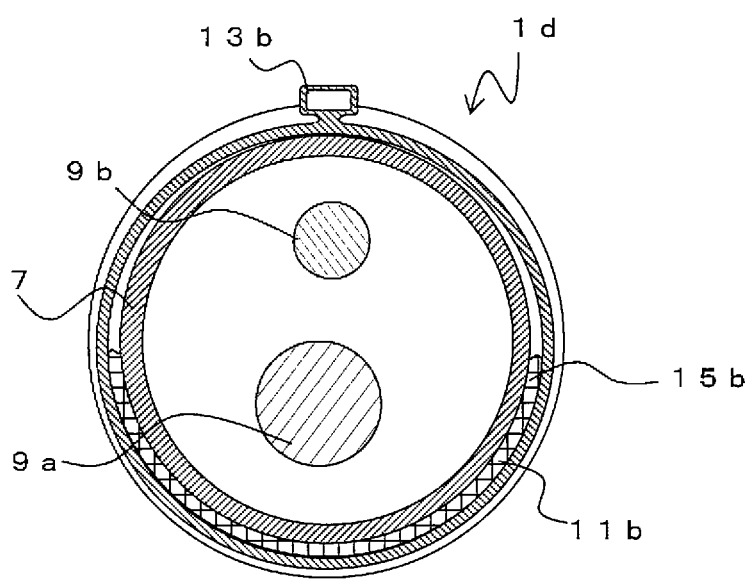
FIG. 17B is a cross-sectional view of the portion of a crimp member 13b of another embodiment of the electromagnetic shield structure 1d.

FIG. 17A is a cross-sectional view of the crimp member 13a in this case, and FIG. 17B is a cross-sectional view of the crimp member 13b. The braided wire 11b fixed on the base portion side of the electromagnetic shield pipe 3 is disposed from the end portion side to the base portion side of the electromagnetic shield pipe 3 at a position in the circumferential direction in which the head portion 14 of the crimp member 13a is not overlapped, thereby avoiding the contact between the braided wire 11b and the head portion 14. This can prevent damage of the braided wire 11b due to the contact with the head portion 14.

Figure 18A:
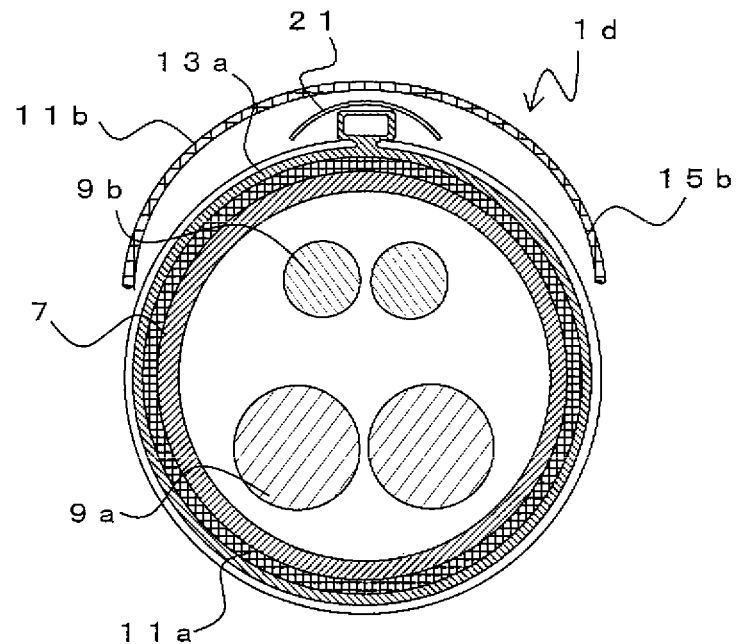
FIG. 18A is a cross-sectional view of the portion of the crimp member 13a of another embodiment of the electromagnetic shield structure 1d.
Figure 18B:
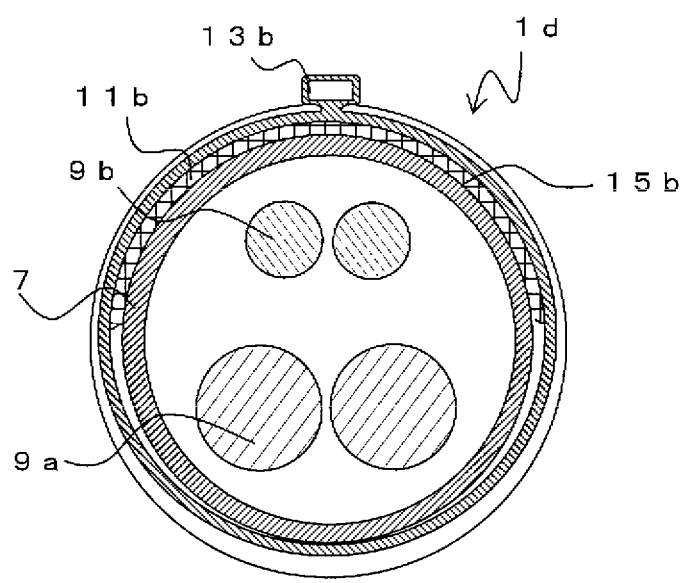
FIG. 18B is a cross-sectional view of the portion of the crimp member 13b of another embodiment of the electromagnetic shield structure 1d.

Note that, as described above, the number of cables inserted into the electromagnetic shield pipe 3 is not limited to two. For example, as illustrated in FIG. 18A and FIG. 18B that are cross-sectional views of a portion where the crimp member 13a and 13b are disposed, the cables 9a and 9b may be not one, but may be a plurality. Even in this case, the cables 9a and 9b exposed from the electromagnetic shield pipe 3 are respectively covered with the braided wires 11a and 11b, and the braided wires 11a and 11b are crimped at different positions in the longitudinal direction of the electromagnetic shield pipe 3.

In addition, the cables inserted into the electromagnetic shield pipe 3 is not limited to the two systems of the cables 9a and 9b. For example, when three or more cables are inserted into the electromagnetic shield pipe 3, three or more braided wires and crimp members are respectively used, and the braided wires are respectively fixed on the electromagnetic shield pipe 3 at positions different from each other in the longitudinal direction of the electromagnetic shield pipe 3 in such a manner so that respective braided wires are not overlapped with each other in each crimp member.

Next, a manufacturing method of the electromagnetic shield structure 1d will be described. First, the metal layer 7 of the end portion of the electromagnetic shield pipe 3 is exposed. In addition, the cables 9a and 9b are inserted into the electromagnetic shield pipe 3. Note that, in this case, a braided wire may be disposed on the outer circumference of the cable 9a or the cable 9b in the interior of the electromagnetic shield pipe 3.

Figure 19A:
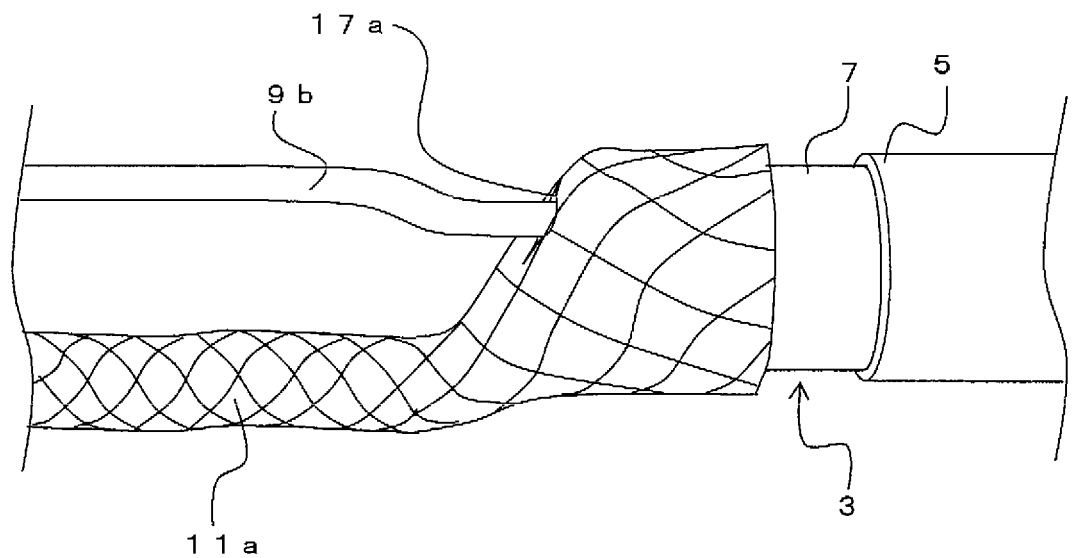
Figure 19B:
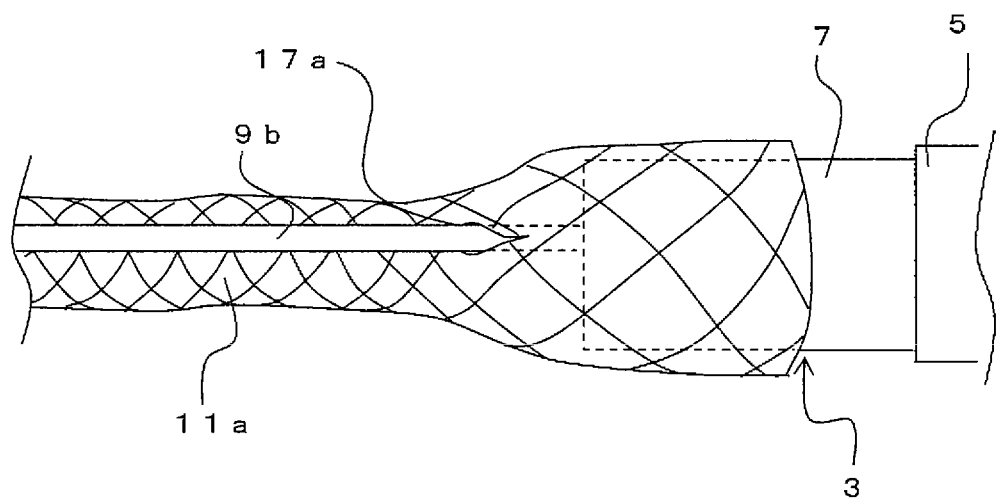

Further, FIG. 19A and FIG. 19B are views illustrating a state where the cable 9b exposed from the electromagnetic shield pipe 3 is covered with the braided wire 11a, and FIG. 19A is a side view, and FIG. 19B is a plan view. The end portion of the braided wire 11a covers the end portion (the metal layer 7) of the electromagnetic shield pipe 3 while being in a cylindrical shape. In this case, the covering interference of the braided wire 11a is adjusted so as to expose the metal layer 7 between the end portion of the braided wire 11a and the outer layer 5.

Note that the stitches of the braided wire 11a can be easily expanded, so that the diameter of the cylinder can be easily increased while the cylindrical shape is maintained. Thus, even when the braided wire 11a in accordance with the size of the cable 9a is used, the end portion of the braided wire 11a can be expanded and to cover the outer circumference of the electromagnetic shield pipe 3.

The hole 17a is formed in part of the braided wire 11a. The hole 17a is formed by expanding the metallic elemental wires of the braided wire 11a to both sides. The hole 17a is formed on the base portion side of the braided wire 11a with respect to a portion caused to cover the electromagnetic shield pipe 3. The hole 17a is a portion penetrated by the cable 9b. Thus, when the cable 9a is inserted from the end portion of the braided wire 11a, the cable 9b is also simultaneously inserted into the braided wire 11a, and the cable 9b is taken out from the hole 17a to the outside. Note that the hole 17a may be formed by opening the cylindrical shape of the braided wire 11a.

Figure 20:
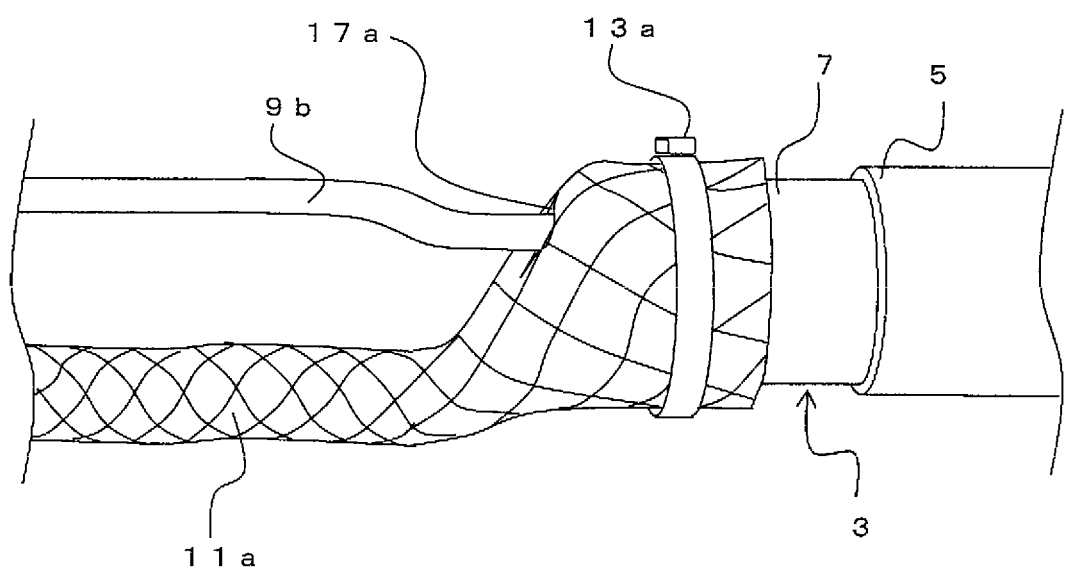

Next, as illustrated in FIG. 20, the braided wire 11a is crimped and fixed by the crimp member 13a on the metal layer 7 of the end portion of the electromagnetic shield pipe 3. Thus, the braided wire 11a is fixed in a state of being disposed across the entire circumference of the metal layer 7.

Figure 21A:
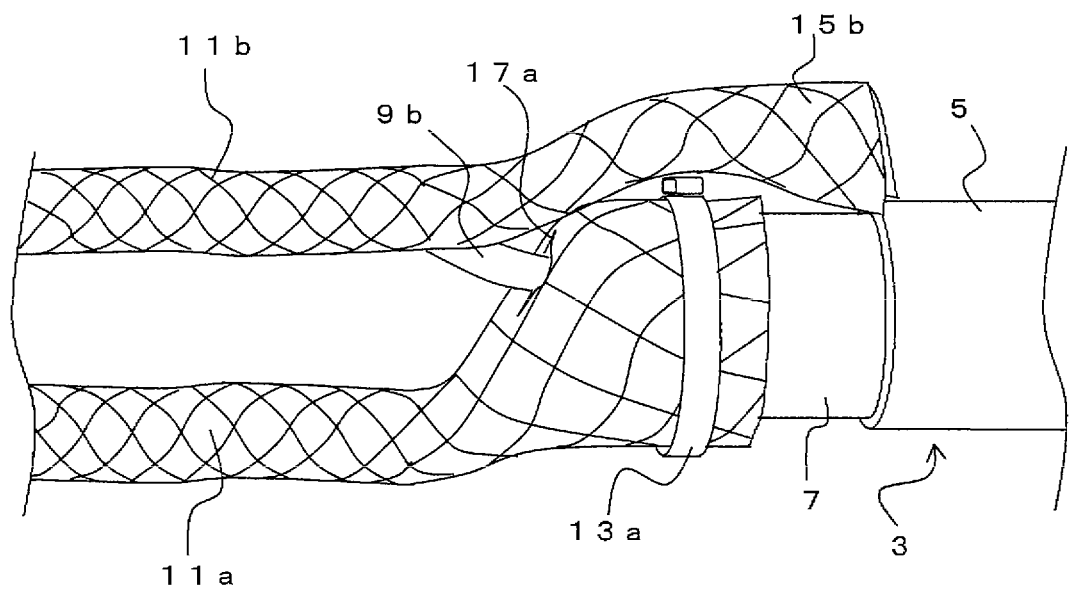
FIG. 21A is a side view illustrating a state where the cable 9b is covered with the braided wire 11b.
Figure 21B:
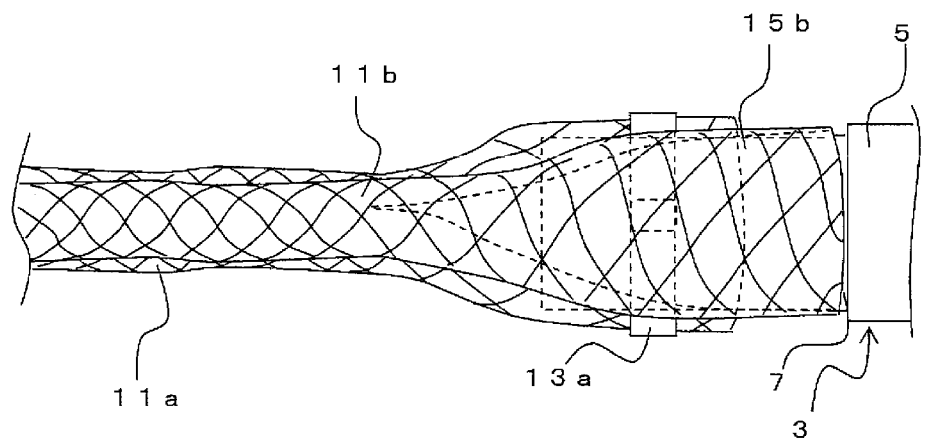
FIG. 21B is a plan view illustrating a state where the cable 9b is covered with the braided wire 11b.

Further, FIG. 21A and FIG. 21B are views illustrating a state where the cable 9b exposed from the electromagnetic shield pipe 3 (the braided wire 11a) is covered with the braided wire 11b, and FIG. 21A is a side view, and FIG. 21B is a plan view. The cylindrical portion of the end portion (the electromagnetic shield pipe 3 side) of the braided wire 11b is loosen, and the sheet-like portion 15b having a predetermined length is formed.

The sheet-like portion 15b of the end portion of the braided wire 11b is arranged on the outside of the braided wire 11a and the crimp member 13a and disposed on the outer circumference of the metal layer 7 exposed between the braided wire 11a and the outer layer 5. In this state, the braided wire 11b is crimped and fixed with the crimp member 13b on the electromagnetic shield pipe 3. In this case, the braided wire 11a is disposed not to be overlapped with a portion on which the braided wire 11b is crimped with the crimp member 13b. In this state, the end portion (crimp portion) of the electromagnetic shield pipe 3 is covered with a rubber member or the like as appropriate. As described above, the electromagnetic shield structure 1d is formed.

According to the Fifth Embodiment, the same effect as that of the First Embodiment can be achieved. In addition, the braided wires 11a and 11b are crimped on the respective crimp portions without being overlapped with each other at different positions in the longitudinal direction of the electromagnetic shield pipe 3. Consequently, in the portions where the crimp members 13a and 13b are disposed, there is no overlapping portion between the braided wires 11a and 11b, and the entire outer circumferential surface of each of the braided wires 11a and 11b is pressed by the crimp members 13a and 13b from the outer circumferential side, and the stable holding strength by the crimp members 13a and 13b can be secured.

In addition, the braided wire 11a is disposed substantially on the entire circumference in the circumferential direction of the electromagnetic shield pipe 3, and the braided wire 11b is disposed substantially on a semicircle in the circumferential direction of the electromagnetic shield pipe 3, so that sufficient contact areas with respect to the metal layer 7 can be respectively secured.

In addition, the protective member 21 is disposed between the braided wire 11b and the head portion 14 of the crimp member 13a, thereby preventing damage of the braided wire 11b due to the head portion 14.

In addition, the braided wire 11b is disposed at a position different from that of the head portion 14 in the circumferential direction to avoid the head portion 14 of the crimp member 13a, thereby preventing damage of the braided wire 11b due to the head portion 14.

Sixth Embodiment

Figure 22A:
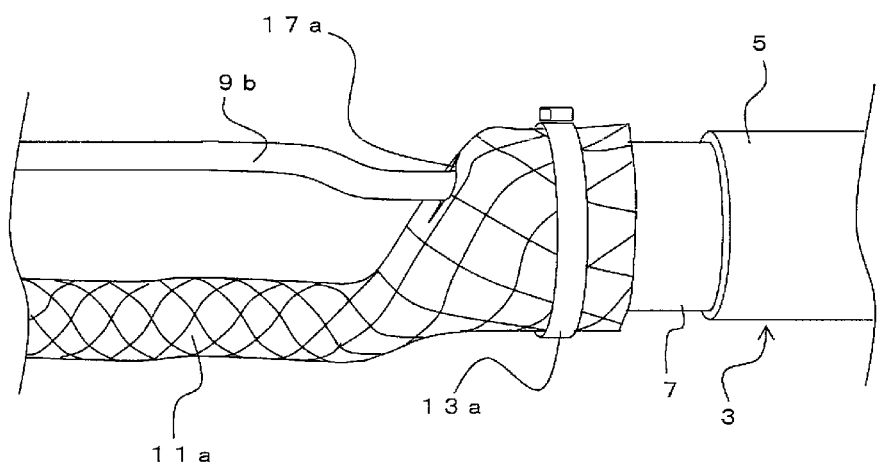

Next, a Sixth Embodiment will be described. FIG. 22A is a side view illustrating processes for forming an electromagnetic shield structure according to the Sixth Embodiment.

In the Sixth Embodiment, as is the case with the Fifth Embodiment, first, as illustrated in FIG. 22A, the cable 9a exposed from the electromagnetic shield pipe 3 is inserted into the braided wire 11a. The end portion of the braided wire 11a is caused to cover the end portion (the metal layer 7) of the electromagnetic shield pipe 3 while being in a cylindrical shape. In this case, the metal layer 7 is exposed between the braided wire 11a and the outer layer 5.

The hole 17a is formed in a part of the braided wire 11a. As described above, the hole 17a is a portion penetrated by the cable 9b. Thus, when the cable 9a is inserted into the braided wire 11a, the cable 9b is also inserted into the braided wire 11a, and the cable 9b is taken out from the hole 17a to the outside. In this state, the braided wire 11a is fixed with the crimp member 13a on the metal layer 7.

Figure 22B:
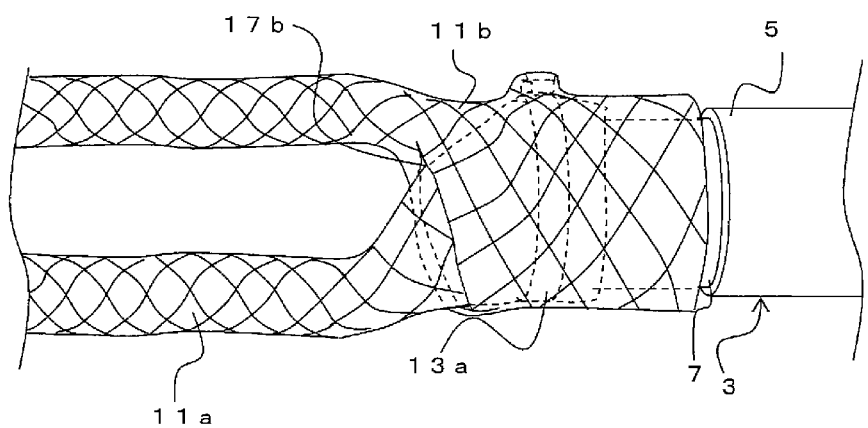
FIG. 22B is a side view illustrating a state where the cable 9b is covered with the braided wire 11b.

Further, FIG. 22B is a side view illustrating a state where the cable 9b is covered with the braided wire 11b. The sheet-like portion 15b is not formed at the end portion of the braided wire 11b being in a cylindrical shape. The hole 17b penetrated by the braided wire 11a (the cable 9a) is formed in the braided wire 11b.

In this case, first, both the braided wire 11a (the cable 9a) and the cable 9b are inserted from the end portion of the braided wire 11b, and only the braided wire 11a (the cable 9a) is taken out from the hole 17b to the outside of the braided wire 11b, and the cable 9b is inserted into the braided wire 11b as it is.

The end portion of the braided wire 11b is caused to cover the exposed portion of the metal layer 7 through the outside of the braided wire 11a and the crimp member 13a. That is, on the outer circumference of the metal layer 7 of the electromagnetic shield pipe 3, the braided wire 11a is disposed across the entire circumference, and the braided wire 11b is disposed across substantially the entire outer circumference of the metal layer 7 on the base portion side of the electromagnetic shield pipe 3 with respect to the braided wire 11a.

Figure 23:
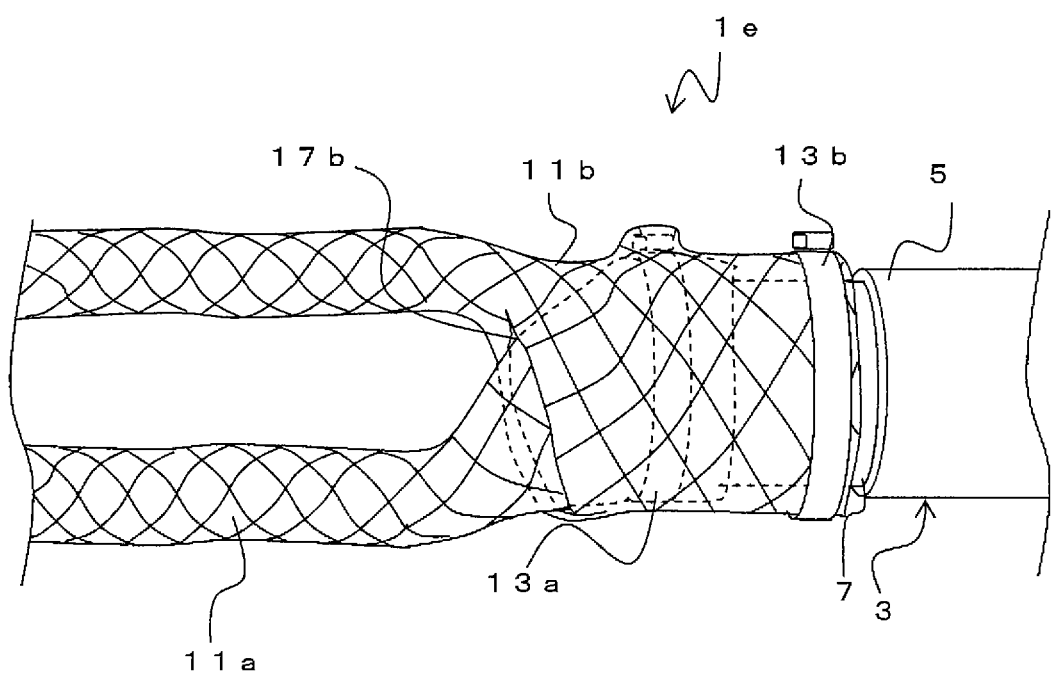
FIG. 23 is a side view illustrating an electromagnetic shield structure 1e.
Figure 24A:
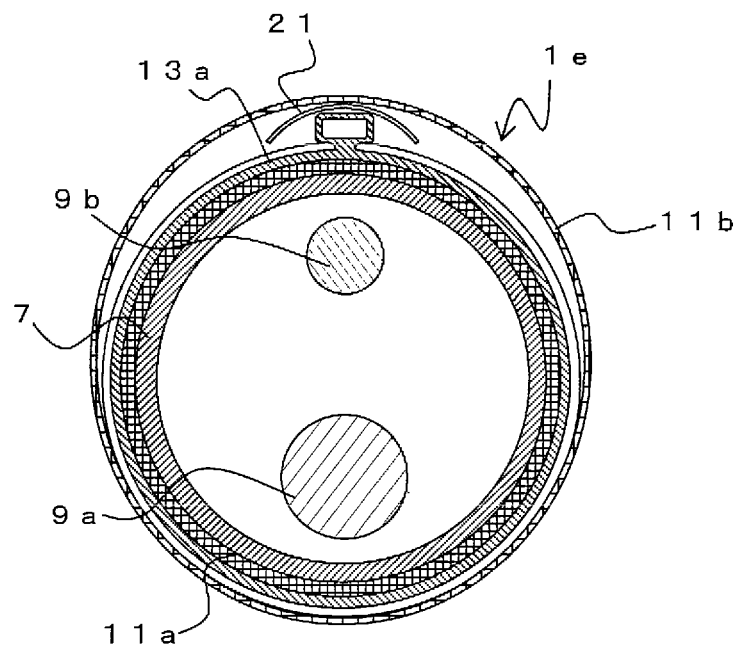
FIG. 24A is a cross-sectional view of the portion of the crimp member 13a of the electromagnetic shield structure 1e.
Figure 24B:
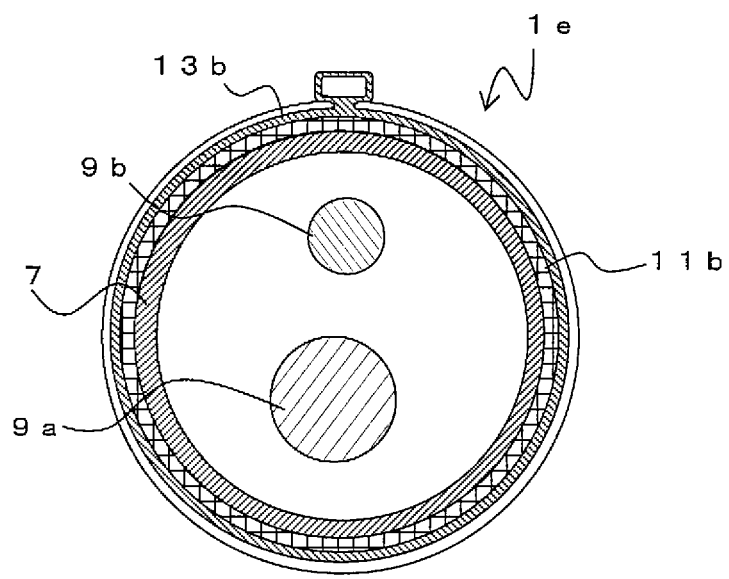
FIG. 24B is a cross-sectional view of the portion of the crimp member 13b of the electromagnetic shield structure 1e.

Further, FIG. 23 is a view illustrating an electromagnetic shield structure 1e in which the braided wire 11b is fixed with the crimp member 13b, and FIG. 24A is a cross-sectional view of a portion where the crimp member 13a is disposed, and FIG. 24B is a cross-sectional view of a portion where the crimp member 13b is disposed. As illustrated, the braided wires 11a and 11b are fixed with the crimp members 13a and 13b on the metal layer 7 of the electromagnetic shield pipe 3 at different positions in the longitudinal direction of the electromagnetic shield pipe 3.

As illustrated in FIG. 24A and FIG. 24B, the end portions of the braided wires 11a and 11b respectively cover the outer circumference of the electromagnetic shield pipe 3 while being in a cylindrical shape. In this case, the cylindrical braided wires 11a and 11b are respectively disposed across the entire circumference of the electromagnetic shield pipe 3, so that the braided wires 11a and 11b are fixed across the entire outer circumference of the electromagnetic shield pipe 3 in the respective crimp portions.

According to the Sixth Embodiment, the same effect as that of the Fifth Embodiment can be achieved. That is, the braided wires 11a and 11b are respectively fixed at different positions in the longitudinal direction of the electromagnetic shield pipe 3, and thus the stability of holding strength or the stability of an energized state of the braided wires 11a and 11b can be obtained.

In addition, the braided wire 11a penetrates the braided wire 11b through the hole 17b, and the braided wires 11a and 11b are fixed substantially on the entire circumference in the circumferential direction of the electromagnetic shield pipe 3 on the respective portions. Thus, both the braided wires 11a and 11b are respectively in contact with the metal layer 7 across the entire circumference, so that the contact areas between the braided wires 11a and 11b and the metal layer 7 can be secured.

Seventh Embodiment

Figure 25A:
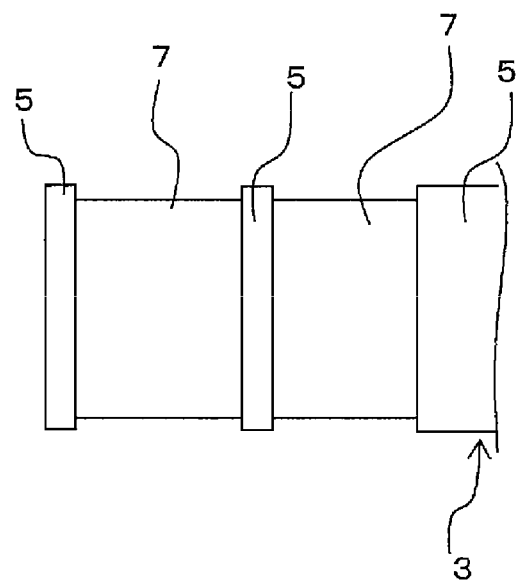
FIG. 25A is a plan view illustrating the electromagnetic shield pipe 3.
Figure 25B:
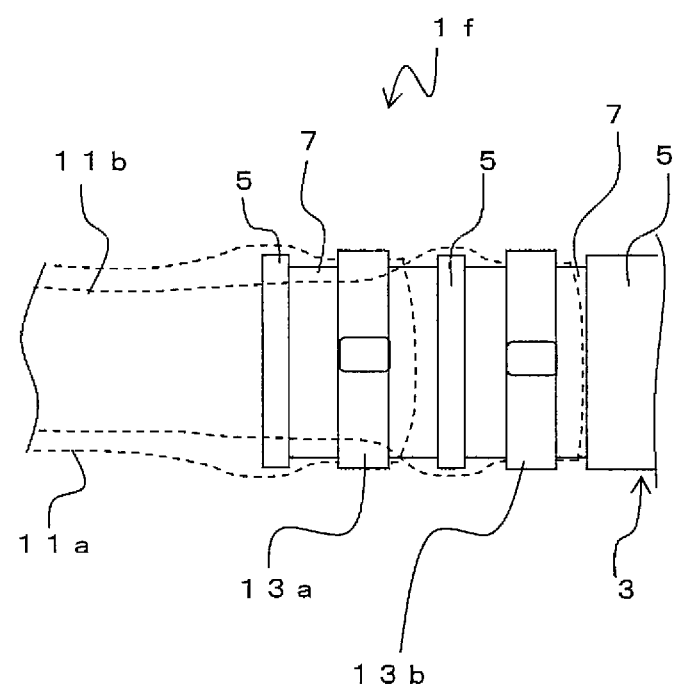
FIG. 25B is a plan view illustrating an electromagnetic shield structure 1f.

Next, a Seventh Embodiment will be described. FIG. 25A is a side view illustrating an electromagnetic shield pipe 3, and FIG. 25B is a side view illustrating an electromagnetic shield structure 1f according to the Seventh Embodiment. Note that FIG. 25B is a perspective view of the braided wires 11a and 11b, and the illustration of cables is omitted.

In the present embodiment, the outer layer 5 in the vicinity of the end portion of the electromagnetic shield pipe 3 is not entirely removed, but the outer layer 5 partially remains in an annular form. That is, the exposed portions of the metal layers 7 are classified by the outer layers 5, and each of the exposed portions of the metal layers 7 is caught by the outer layers 5 and formed in an annular shape.

As illustrated in FIG. 25B, the braided wires 11a and 11b are crimped by the crimp members 13a and 13b on the respective metal layers 7. Thus, the braided wires 11a and 11b steadily comes in contact with the metal layers 7, which leads to electrical conduction. Note that the braided wire 11a is crimped with the crimp member 13a, thereby coming into contact with the metal layer 7. The braided wire 11b is crimped with the crimp member 13b, comes into contact with the metal layer 7, and is disposed outside the braided wire 11a and the crimp member 13a.

In this case, the annular outer layer 5 on the tip end side is positioned on the tip end side with respect to the crimping position of the crimp member 13a and the second annular outer layer 5 is disposed between the crimping positions of the respective crimp members 13a and 13b. The annular outer layer 5 has a larger outer diameter than that of the exposed portion of the metal layer 7. Thus, a large diameter portion formed by the annular outer layer 5 is provided on the tip end side of the crimping position of each of the crimp members 13a and 13b with respect to the electromagnetic shield pipe 3. Thus, even when the braided wires 11a and 11b are pulled, and the crimp members 13a and 13b are shifted to the tip end side, the movement of the crimp members 13a and 13b is regulated by the outer layer 5. Consequently, the crimp members 13a and 13b can be prevented from coming off from the electromagnetic shield pipe 3.

According to the Seventh Embodiment, the same effect as that of the Fifth Embodiment can be achieved. That is, the braided wires 11a and 11b are respectively fixed at different positions in the longitudinal direction of the electromagnetic shield pipe 3, and thus the stability of holding strength or the stability of an energized state of the braided wires 11a and 11b can be obtained.

In addition, the outer layers 5 provided in an annular form function as a stopper for preventing the crimp members 13a and 13b from coming off, so that the outer layers 5 can prevent the crimp members 13a and 13b from coming off from the electromagnetic shield pipe 3. Note that, in place of the outer layers 5, another member such as resin may be adhered to the outer circumferential portion of the metal layer 7 in an annular form, thereby forming a large diameter portion on the tip end side of each of the crimping positions.

Although embodiments of the present invention have been described above with reference to the accompanying drawings, the technical scope of the present invention is not affected by the above-described embodiments. It will be apparent to those skilled in the art that various variations and modifications can be made to the present invention within the scope of the technical ideas described in the appended claims. Thus, it is intended that these variations and modifications are within the technical scope of the present invention.

For example, the above-described embodiments can be combined with one another.

The invention claimed is:
1. An electromagnetic shield structure comprising:
an electromagnetic shield pipe;
a plurality of cables configured to be inserted into the electromagnetic shield pipe and exposed from an end portion of the electromagnetic shield pipe; and
a plurality of cylindrical flexible shield members configured to cover the plurality of cables exposed from the end portion of the electromagnetic shield pipe, wherein
each of the plurality of cylindrical flexible shield members is a braided member consisting of a plurality of metallic elemental wires,
the plurality of cylindrical flexible shield members is fixed with a crimp member on an outer circumference of the electromagnetic shield pipe,
an entire outer circumferential surface of each of the plurality of cylindrical flexible shield members is pressed by the crimp member from an outer circumferential side, on a cross section perpendicular to a longitudinal direction of the electromagnetic shield pipe in a portion where the crimp member is disposed,
the plurality of cylindrical flexible shield members is fixed with the crimp member at an identical position in the longitudinal direction of the electromagnetic shield pipe, and
the plurality of cylindrical flexible shield members is fixed with the crimp member in a state of being overlapped across an entire circumference in a circum- ferential direction, on a cross section perpendicular to the longitudinal direction of the electromagnetic shield pipe.

2. A wire harness comprising:

the electromagnetic shield structure according to claim 1; and the plurality of cables disposed in an interior of the electromagnetic shield pipe.

* * * * *